(12) United States Patent
Park et al.

(10) Patent No.: US 11,893,187 B2
(45) Date of Patent: Feb. 6, 2024

(54) DISPLAY DEVICE IN WHICH TRANSMISSION SIGNALS ARE VARYINGLY GENERATED BASED ON A SYNCHRONIZATION SIGNAL

(71) Applicant: Samsung Display Co., Ltd., Yongin-Si (KR)

(72) Inventors: Jinwoo Park, Yongin-si (KR); Taejoon Kim, Seongnam-si (KR); Jungmok Park, Hwaseong-si (KR); Il Ho Lee, Gwangju (KR); Wankee Jun, Anyang-si (KR); Hyun-Wook Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 12 days.

(21) Appl. No.: 17/717,315

(22) Filed: Apr. 11, 2022

(65) Prior Publication Data

US 2023/0022093 A1 Jan. 26, 2023

(30) Foreign Application Priority Data

Jul. 21, 2021 (KR) .......................... 10-2021-0095734

(51) Int. Cl.
*G06F 3/041* (2006.01)
*H10K 59/40* (2023.01)

(52) U.S. Cl.
CPC ......... *G06F 3/04184* (2019.05); *H10K 59/40* (2023.02)

(58) Field of Classification Search
CPC .......................... G06F 3/04184; H10K 59/40
See application file for complete search history.

(56) References Cited

U.S. PATENT DOCUMENTS

| 9,189,113 | B2 | 11/2015 | Yoshimura |
| 10,042,470 | B2 | 8/2018 | Shin et al. |
| 10,614,279 | B2 | 4/2020 | Kim et al. |
| 10,908,758 | B2 | 2/2021 | Rhe et al. |
| 2017/0038884 | A1* | 2/2017 | Qiao .................. G06F 3/04166 |

FOREIGN PATENT DOCUMENTS

| KR | 10-2013-0136671 | 12/2013 |
| KR | 10-2017-0119282 | 10/2017 |
| KR | 10-2018-0132499 | 12/2018 |
| KR | 10-2019-0114458 | 10/2019 |

* cited by examiner

*Primary Examiner* — Afroza Chowdhury
(74) *Attorney, Agent, or Firm* — F. Chau & Associates, LLC

(57) ABSTRACT

A display device including: a display panel configured to display an image in units of a frame; an input sensor disposed on the display panel, and configured to sense an external input; a panel driver configured to control driving of the display panel in response to a synchronization signal; and a sensor controller configured to control driving of the input sensor, wherein the sensor controller receives the synchronization signal from the panel driver and outputs a plurality of transmission signals to the input sensor, and the plurality of transmission signals are varyingly generated based on the synchronization signal.

18 Claims, 17 Drawing Sheets

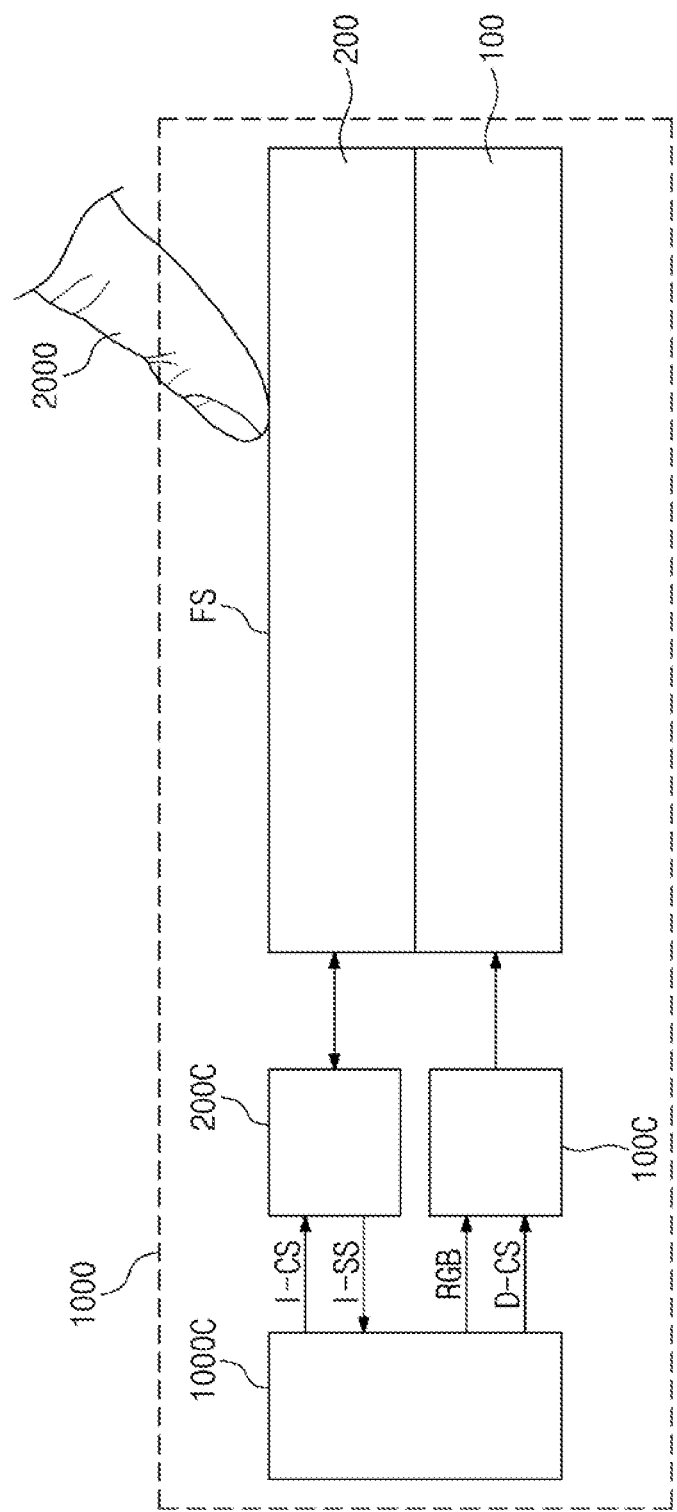

FIG. 8A

LUT1

| | bit Information | Duration |
|---|---|---|
| 1 | 00 | 0.1μs |
| 2 | 01 | 0.3μs |
| 3 | 10 | 0.5μs |
| 4 | 11 | 0.7μs |

FIG. 8B

LUT2

| | bit Information | Duration |
|---|---|---|
| 1 | 000 | 0.1μs |
| 2 | 001 | 0.2μs |
| 3 | 010 | 0.3μs |
| 4 | 011 | 0.4μs |
| 5 | 100 | 0.5μs |
| 6 | 101 | 0.6μs |
| 7 | 110 | 0.7μs |
| 8 | 111 | 0.8μs |

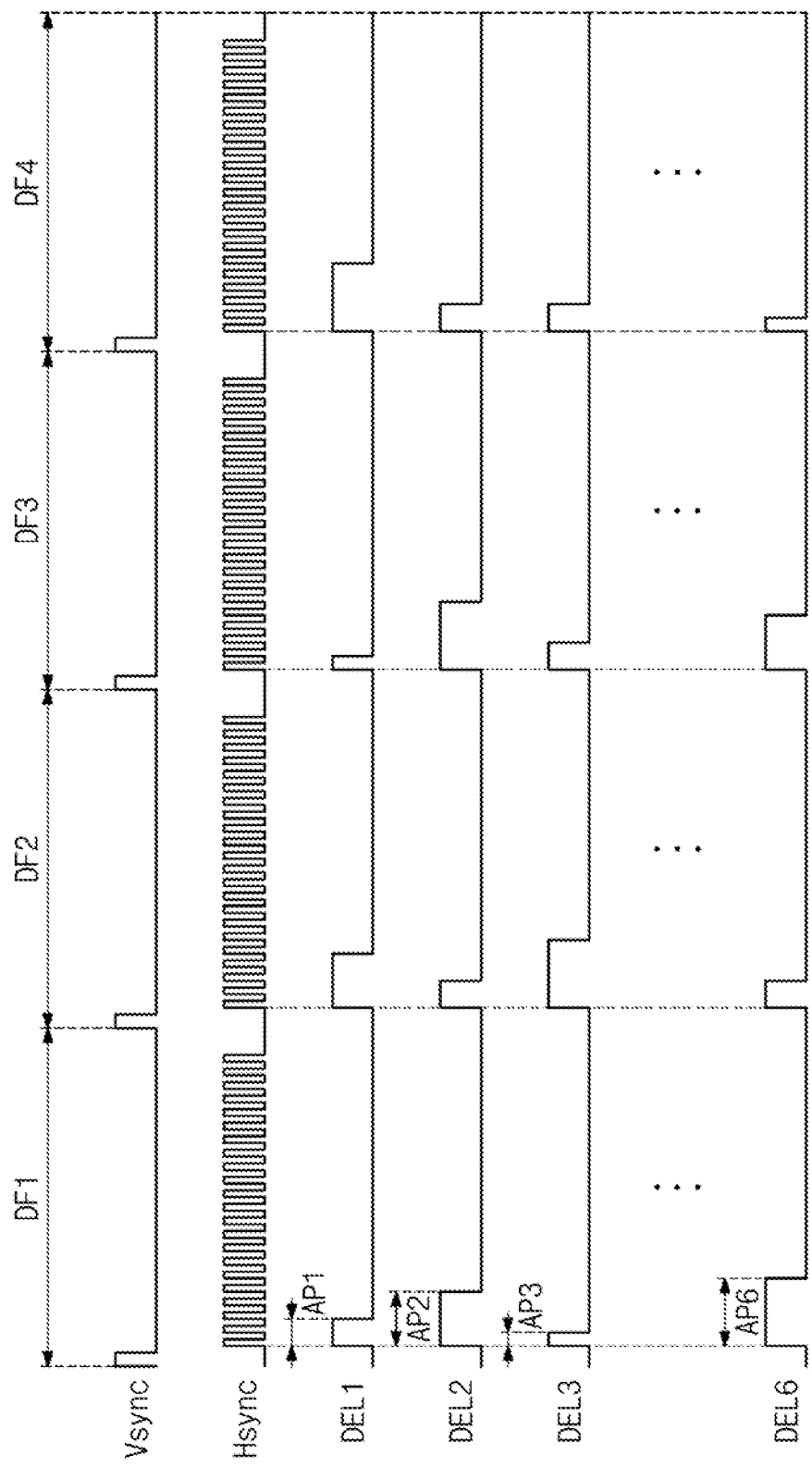

DISPLAY DEVICE IN WHICH TRANSMISSION SIGNALS ARE VARYINGLY GENERATED BASED ON A SYNCHRONIZATION SIGNAL

CROSS-REFERENCE TO RELATED APPLICATION

This application claims priority under 35 U.S.C. § 119 to Korean Patent Application No. 10-2021-0095734 filed on Jul. 21, 2021, in the Korean Intellectual Property Office, the disclosure of which is incorporated by reference herein in its entirety.

TECHNICAL FIELD

Embodiments of the present disclosure relate a display device, and more particularly, to a display device whose display quality is increased.

DISCUSSION OF RELATED ART

A display device is an output device for presentation of information in visual form. Various display devices are applied to a multimedia electronic device such as a television, a tablet computer, a navigation system, or a game console. In addition to a general input device such as a button, a keyboard, or a mouse, an electronic device may include an input sensor that senses a touch-based input, thereby allowing a user to enter information or commands easily and intuitively.

SUMMARY

Embodiments of the present disclosure provide a display device capable of reducing the degradation of display quality due to a noise coming from an input sensor.

According to an embodiment of the present disclosure, a display device includes: a display panel configured to display an image in units of a frame; an input sensor disposed on the display panel, and configured to sense an external input; a panel driver configured to control driving of the display panel in response to a synchronization signal; and a sensor controller configured to control driving of the input sensor, wherein the sensor controller receives the synchronization signal from the panel driver and outputs a plurality of transmission signals to the input sensor, and the plurality of transmission signals are varyingly generated based on the synchronization signal.

According to an embodiment of the present disclosure, a display device includes: a display panel configured to display an image in units of a frame; an input sensor disposed on the display panel, and configured to sense an external input; a panel driver configured to control driving of the display panel in response to a vertical synchronization signal for determining a period of the frame and a horizontal synchronization signal for determining a scan timing of the display panel; and a sensor controller configured to control driving of the input sensor, wherein the sensor controller receives the horizontal synchronization signal from the panel driver and outputs a plurality of transmission signals to the input sensor, and the plurality of transmission signals are varied based on the horizontal synchronization signal.

BRIEF DESCRIPTION OF THE FIGURES

The above and other features of the present disclosure will become apparent by describing in detail embodiments thereof with reference to the accompanying drawings.

FIG. 2 is a diagram for describing an operation of a display device according to an embodiment of the present disclosure.

FIG. 8A is a diagram illustrating delay information stored in a store table according to an embodiment of the present disclosure.

FIG. 8B is a diagram illustrating delay information stored in a store table according to an embodiment of the present disclosure.

FIG. 9A is a waveform diagram illustrating delay signals according to an embodiment of the present disclosure.

DETAILED DESCRIPTION OF THE EMBODIMENTS

Figure 1:
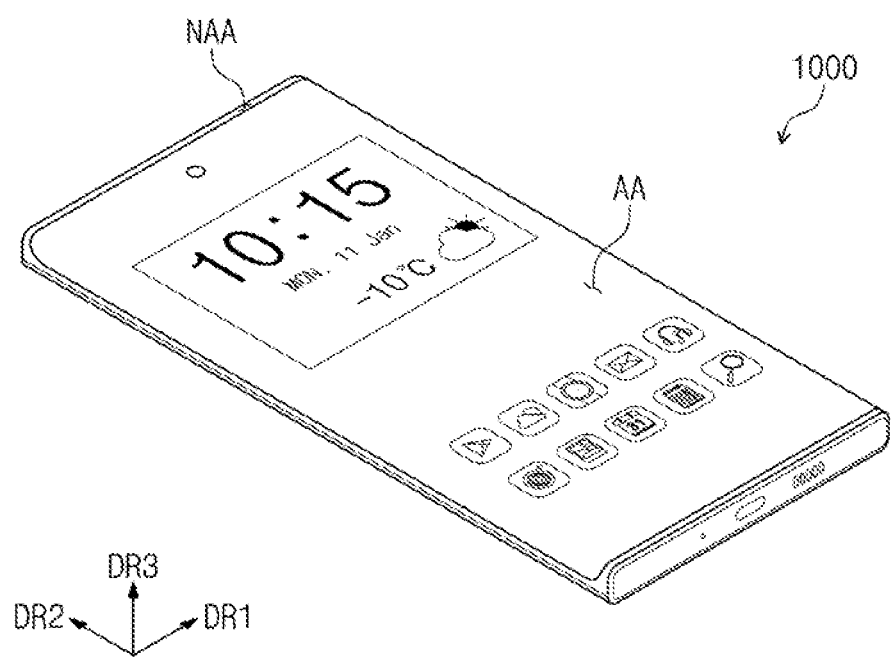
FIG. 1 is a perspective view of a display device according to an embodiment of the present disclosure.

Hereinafter, embodiments of the present disclosure will be described in detail with reference to the accompanying drawings. While the present disclosure is subject to various modifications and alternative forms, specific embodiments thereof are shown by way of examples in the drawings and will herein be described in detail. It should be understood, however, that there is no intent to limit the present disclosure to the particular forms disclosed, but on the contrary, the present disclosure is considered to cover all modifications, equivalents, and alternatives falling within the spirit and scope thereof.

Similar reference numerals may be used for similar components throughout this disclosure. In the accompanying drawings, the dimensions of structures may be illustrated as being enlarged for effective description of embodiments of the present disclosure. Although the terms "first", "second", etc. may be used to describe various components, the components should not be construed as being limited by the terms. The terms are used to distinguish one component from another component. For example, a first component may be referred to as a second component, and similarly, the second component may be referred to as the first component. The articles "a," "an," and "the" are intended to include the plural forms as well, unless the context clearly indicates otherwise.

It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

In the specification, it will be understood that when a portion of a layer, a film, an area, a plate, etc. is referred to as being "on" or "over" any other portion, it can be "directly on" the other portion or an intervening portion can be present therebetween. On the other hand, it will be understood that when a portion of a layer, a film, an area, a plate, etc. is referred to as being "under" or "below" any other portion, it can be "directly under" the other portion or an intervening portion can be present therebetween. In addition, in the specification, the expression "disposed on" may include "disposed under" as well as "disposed on".

In addition, in the specification, the expression "direct contact" may mean that an additional layer, film, region, plate, etc. are absent between a layer, film, area, plate, etc. and another element. For example, "directly contact" may mean that two layers or two members are disposed without using an additional member, such as an adhesive member, between the layers or members.

FIG. 1 is a perspective view of a display device according to an embodiment of the present disclosure.

Referring to FIG. 1, a display device 1000 may be a device that is activated by an electrical signal. For example, the display device 1000 may be a rigid smartphone, a foldable smartphone, a notebook, a television, a tablet, a navigation system for a vehicle, a game console, or a wearable device, but is not particularly limited to any one thereof. The display device 1000 is illustrated in FIG. 1 by way of example as being a smartphone.

An active area AA and a peripheral area NAA may be provided in the display device 1000. The display device 1000 may display an image through the active area AA. The active area AA may include a surface extended along a first direction DR1 and a second direction DR2. The peripheral area NAA may surround the active area AA.

A thickness direction of the display device 1000 may be parallel to a third direction DR3 intersecting the first direction DR1 and the second direction DR2. Accordingly, front surfaces (or upper surfaces) and back surfaces (or lower surfaces) of members constituting the display device 1000 may be described with respect to the third direction DR3.

FIG. 2 is a diagram for describing an operation of a display device according to an embodiment of the present disclosure.

Referring to FIG. 2, the display device 1000 may include a display panel 100, an input sensor 200, a panel driver 100C, a sensor controller 200C, and a main controller 1000C.

The display panel 100 may be a component that substantially generates an image. The image generated through the display panel 100 may be displayed on a display surface FS of the display device 1000. The display panel 100 may be a light-emitting display panel. For example, the display panel 100 may be an organic light-emitting display panel, an inorganic light-emitting display panel, a quantum dot display panel, a micro-light emitting diode (LED) display panel, or a nano-LED display panel.

The input sensor 200 may be disposed on the display panel 100. The input sensor 200 may sense an external input 2000 applied from the outside. The external input 2000 may include all input through an input means capable of providing a change in capacitance. For example, the input sensor 200 may sense an input by an active-type input means (e.g., an active pen, a stylus pen, or an electronic pen) sending and receiving a signal, as well as an input by a passive-type input means such as a body (e.g., a finger) of a user. In addition, the input sensor 200 may sense an approach of an object close to the display surface FS of the display device 1000.

The main controller 1000C may control overall operations of the display device 1000. For example, the main controller 1000C may control operations of the panel driver 100C and the sensor controller 200C. The main controller 1000C may include at least one microprocessor, and the main controller 1000C may be referred to as a "host". The main controller 1000C may further include a graphics controller.

The panel driver 100C may drive the display panel 100. The panel driver 100C may receive image data RGB and a display control signal D-CS from the main controller 1000C. The display control signal D-CS may include various control signals. For example, the display control signal D-CS may include a vertical synchronization signal, a horizontal synchronization signal, a main clock, a data enable signal, and the like. The panel driver 100C may generate a scan control signal and a data control signal for controlling the driving of the display panel 100 based on the display control signal D-CS.

The sensor controller 200C may control the driving of the input sensor 200. The sensor controller 200C may receive a sensing control signal I-CS from the main controller 1000C. The main controller 1000C may provide the sensor controller 200C with some of the signals included in the display control signal D-CS, for example, the vertical synchronization signal and/or the horizontal synchronization signal, as well as the sensing control signal I-CS. Alternatively, the panel driver 100C may provide the sensor controller 200C with some of the signals included in the display control signal D-CS received from the main controller 1000C, for example, the vertical synchronization signal and/or the horizontal synchronization signal.

The sensor controller 200C may calculate coordinate information of a user input based on a signal received from the input sensor 200 and may provide a coordinate signal I-SS including the coordinate information to the main controller 1000C. The main controller 1000C executes an operation corresponding to the user input based on the coordinate signal I-SS. For example, the main controller 1000C may drive the panel driver 100C such that a new application image is displayed on the display panel 100.

Figure 3A:
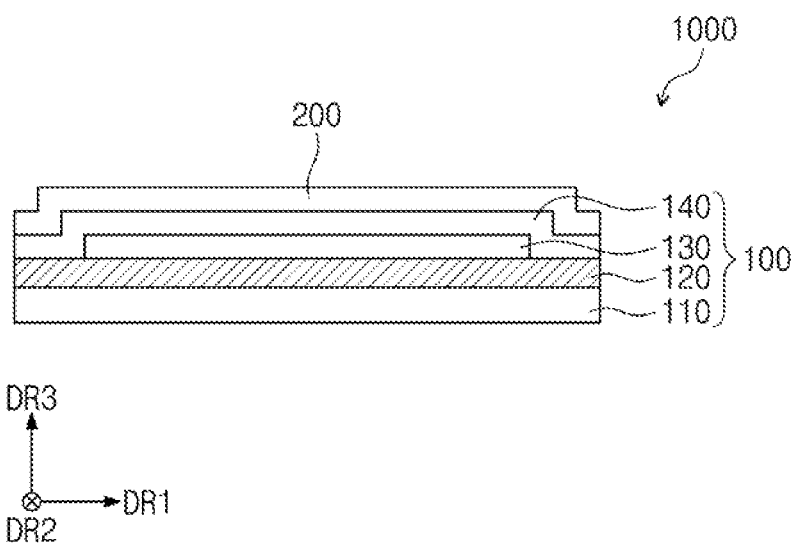
FIG. 3A is a cross-sectional view of a display device according to an embodiment of the present disclosure.

FIG. 3A is a cross-sectional view of a display device according to an embodiment of the present disclosure.

Referring to FIG. 3A, the display device 1000 may include the display panel 100 and the input sensor 200. The display panel 100 may include a base layer 110, a circuit layer 120, a light-emitting element layer 130, and an encapsulation layer 140. The base layer 110, the circuit layer 120, the light-emitting element layer 130, and the encapsulation layer 140 may be sequentially stacked.

The base layer 110 may be a member that provides a base surface on which the circuit layer 120 is disposed. The base layer 110 may include a glass material, a metal material, a polymer material, or the like. However, an embodiment of the present disclosure is not limited thereto, and the base layer 110 may be an inorganic layer, an organic layer, or a composite material layer.

The base layer 110 may have a multi-layered structure. For example, the base layer 110 may include a first synthetic resin layer and a second synthetic resin layer disposed on the first synthetic resin layer. Each of the first and second synthetic resin layers may include polyimide-based resin. In addition, each of the first and second synthetic resin layers may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin.

The circuit layer 120 may be disposed on the base layer 110. The circuit layer 120 may include an insulating layer, a semiconductor pattern, a conductive pattern, a signal line, and the like. An insulating layer, a semiconductor layer, and a conductive layer may be formed on the base layer 110 by a coating or deposition process, and the insulating layer, the semiconductor layer, and the conductive layer may then be selectively patterned through a plurality of photolithography processes. Afterwards, the semiconductor pattern, the conductive pattern, and the signal line included in the circuit layer 120 may be formed.

The light-emitting element layer 130 may be disposed on the circuit layer 120. The light-emitting element layer 130 may include a plurality of light-emitting elements. For example, the light-emitting element layer 130 may be an organic light-emitting material, an inorganic light-emitting material, a quantum dot, a quantum rod, a micro LED, or a nano LED.

The encapsulation layer 140 may be disposed on the light-emitting element layer 130. The encapsulation layer 140 may protect the light-emitting element layer 130 from foreign substances such as moisture, oxygen, and dust particles. The encapsulation layer 140 may be in contact with the circuit layer 120 at sides of the light-emitting element layer 130.

The input sensor 200 may be disposed on the display panel 100. The input sensor 200 may sense the external input 2000 (refer to FIG. 2) applied from the outside. The external input 2000 may be a user input. The user input may include various types of external inputs such as a part of the user's body, a light, heat, a pen, pressure, or the like.

The input sensor 200 may be formed on the display panel 100 through sequential processes. In this case, the input sensor 200 may be expressed as being directly disposed on the display panel 100. The expression "directly disposed" may mean that a third component is not interposed between the input sensor 200 and the display panel 100. In other words, a separate adhesive member may not be interposed between the input sensor 200 and the display panel 100. Optionally, the input sensor 200 may be coupled to the display panel 100 through an adhesive member. The adhesive member may include a typical adhesive or a sticking agent.

The display device 1000 may further include an anti-reflection layer and an optical layer, which are disposed on the input sensor 200. The anti-reflection layer may reduce the reflectance of an external light incident from the outside of the display device 1000. The optical layer may increase the front luminance of the display device 1000 by controlling a direction of a light incident from the display panel 100.

Figure 3B:
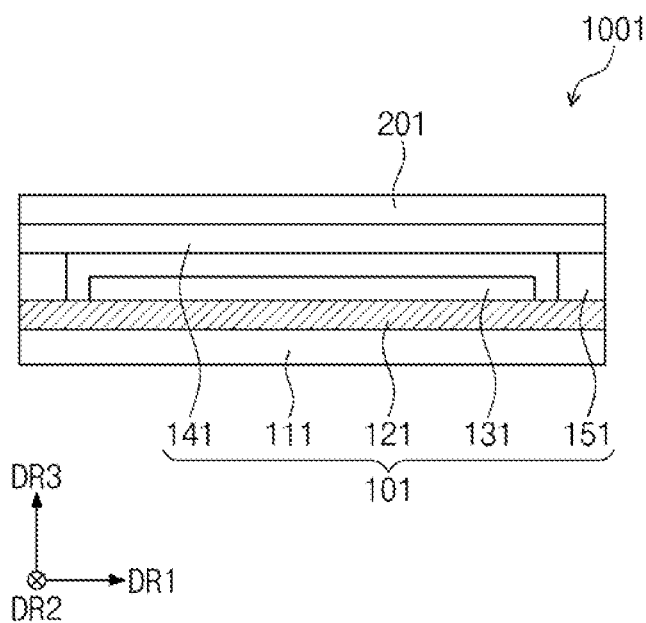
FIG. 3B is a cross-sectional view of a display device according to an embodiment of the present disclosure.

FIG. 3B is a cross-sectional view of a display device according to an embodiment of the present disclosure.

Referring to FIG. 3B, a display device 1001 may include a display panel 101 and an input sensor 201. The display panel 101 may include a base substrate 111, a circuit layer 121, a light-emitting element layer 131, an encapsulation substrate 141, and a coupling member 151.

Each of the base substrate 111 and the encapsulation substrate 141 may be a glass substrate, a metal substrate, a polymer substrate, or the like, but is not particularly limited thereto.

The coupling member 151 may be interposed between the base substrate 111 and the encapsulation substrate 141. For example, the coupling member 151 may be provided directly between the encapsulation substrate 141 and the circuit layer 121. The coupling member 151 may couple the encapsulation substrate 141 to the base substrate 111 or the circuit layer 121. The coupling member 151 may include an inorganic material or an organic material. For example, the inorganic material may include a frit seal, and the organic material may include a photo-curable resin or a photo-plastic resin. However, a material of the coupling member 151 is not limited to the above example.

The input sensor 201 may be directly disposed on the encapsulation substrate 141. The expression "directly disposed" may mean that a third component is not interposed between the input sensor 201 and the encapsulation substrate 141. In other words, a separate adhesive member may not be interposed between the input sensor 201 and the display panel 101. However, the present disclosure is not limited thereto, and an adhesive layer may be further interposed between the input sensor 201 and the encapsulation substrate 141.

Figure 4:
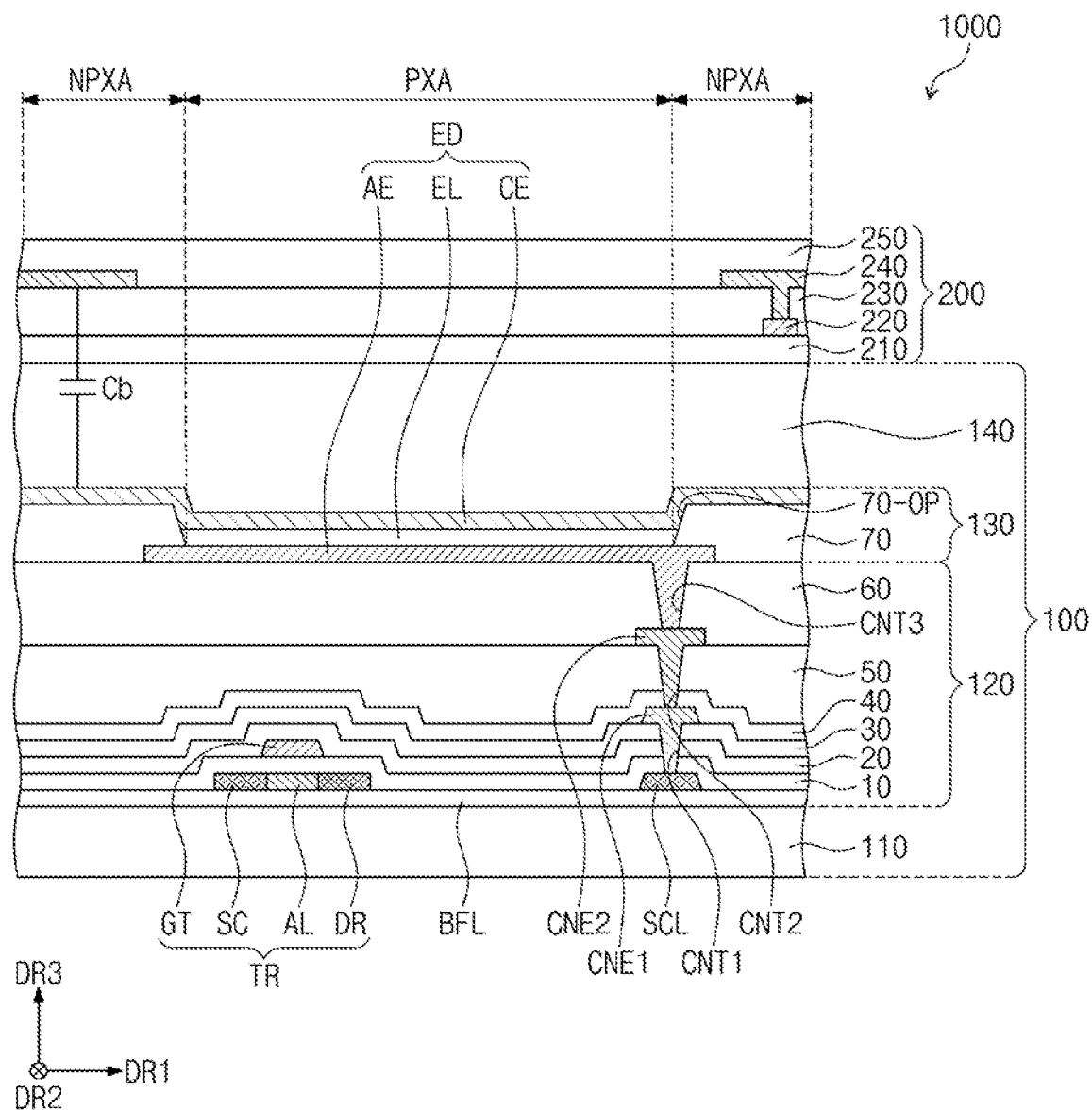
FIG. 4 is a cross-sectional view of a display device according to an embodiment of the present disclosure.

FIG. 4 is a cross-sectional view of a display device according to an embodiment of the present disclosure.

Referring to FIG. 4, at least one inorganic layer may be formed on an upper surface of the base layer 110. The inorganic layer may include at least one of aluminum oxide, titanium oxide, silicon oxide, silicon nitride, silicon oxynitride, zirconium oxide, and hafnium oxide. The inorganic layer may be formed of multiple layers. The multiple inorganic layers may constitute a barrier layer and/or a buffer layer. In this embodiment, the display panel 100 is illustrated as including a buffer layer BFL.

The buffer layer BFL may improve a bonding force between the base layer 110 and a semiconductor pattern. The buffer layer BFL may include at least one of silicon oxide, silicon nitride, and silicon oxynitride. For example, the buffer layer BFL may include a structure in which a silicon oxide layer and a silicon nitride layer are stacked alternately.

The semiconductor pattern may be disposed on the buffer layer BFL. The semiconductor pattern may include polysilicon. However, the present disclosure is not limited thereto, and the semiconductor pattern may include amorphous silicon, low-temperature polycrystalline silicon, or oxide semiconductor.

FIG. 4 only illustrates a portion of the semiconductor pattern, and the semiconductor pattern may be further disposed in another area. Semiconductor patterns may be arranged across pixels in a specific rule. An electrical property of the semiconductor pattern may vary depending on whether it is doped or not. The semiconductor pattern may include a first area having high conductivity and a second area having low conductivity. The first area may be doped with an N-type dopant or a P-type dopant. A P-type transistor may include a doping area doped with the P-type dopant, and an N-type transistor may include a doping area doped with the N-type dopant. The second area may be a non-doping area or may be an area doped with a concentration lower than the first area.

The conductivity of the first area may be greater than the conductivity of the second area, and the first area may serve as an electrode or a signal line. The second area may correspond to an active (or channel) of a transistor. In other words, a portion of the semiconductor pattern may be an active of a transistor, another portion of the semiconductor pattern may be a source or a drain of the transistor, and another portion of the semiconductor pattern may be a connection electrode or a connection signal line.

Each of pixels may be expressed by an equivalent circuit including seven transistors, one capacitor, and a light-emitting element ED, and the equivalent circuit of the pixel may be modified in various forms. One transistor TR and one light-emitting element ED included in a pixel are illustrated in FIG. 4 by way of example.

A source SC, an active AL, and a drain DR of the transistor TR may form from the semiconductor pattern. The source SC and the drain DR may extend from the active AL in directions facing away from each other when viewed from the second direction DR2. In other words, the source SC and the drain DR may be connected to the active AL. A portion of a connection signal wire SCL formed from the semiconductor pattern is illustrated in FIG. 4. The connection signal wire SCL may be connected to the drain DR of the transistor TR in a plan view.

A first insulating layer 10 may be disposed on the buffer layer BFL. The first insulating layer 10 may overlap a plurality of pixels in common and may cover the semiconductor pattern. The first insulating layer 10 may be an inorganic layer and/or an organic layer, and may have a single-layer or multilayer structure. The first insulating layer 10 may include at least one of aluminum oxide, titanium oxide, silicon oxide, silicon nitride, silicon oxynitride, zirconium oxide, and hafnium oxide. In this embodiment, the first insulating layer 10 may be a single silicon oxide layer. As well as the first insulating layer 10, each of insulating layers of the circuit layer 120 to be described later may be an inorganic layer and/or an organic layer, and may have a single-layer or multilayer structure. The inorganic layer may include at least one of the materials described above but is not limited thereto.

A gate GT of the transistor TR is disposed on the first insulating layer 10. The gate GT may be a portion of a metal pattern. The gate GT overlaps the active AL. The gate GT may function as a mask in the process of doping the semiconductor pattern.

A second insulating layer 20 may be disposed on the first insulating layer 10 and may cover the gate GT. The second insulating layer 20 may overlap the pixels in common. The second insulating layer 20 may be an inorganic layer and/or an organic layer, and may have a single-layer or multilayer structure. The second insulating layer 20 may include at least one of silicon oxide, silicon nitride, and silicon oxynitride. In this embodiment, the second insulating layer 20 may have a multilayer structure including a silicon oxide layer and a silicon nitride layer.

A third insulating layer 30 may be disposed on the second insulating layer 20. The third insulating layer 30 may have a single-layer or multilayer structure. For example, the third insulating layer 30 may have a multilayer structure including a silicon oxide layer and a silicon nitride layer.

A first connection electrode CNE1 may be disposed on the third insulating layer 30. The first connection electrode CNE1 may be connected to the connection signal wire SCL through a first contact hole CNT1 penetrating the first, second, and third insulating layers 10, 20, and 30.

A fourth insulating layer 40 may be disposed on the third insulating layer 30. The fourth insulating layer 40 may be a single silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a second contact hole CNT2 penetrating the fourth insulating layer 40 and the fifth insulating layer 50. The second contact hole CNT2 may coincide with the first contact hole CNT1.

A sixth insulating layer 60 may be disposed on the fifth insulating layer 50 and may cover the second connection electrode CNE2. The sixth insulating layer 60 may be an organic layer.

The light-emitting element layer 130 may be disposed on the circuit layer 120. The light-emitting element layer 130 may include the light-emitting element ED. For example, the light-emitting element layer 130 may be an organic light-emitting material, an inorganic light-emitting material, a quantum dot, a quantum rod, a micro LED, or a nano LED. Below, the description will be given under the condition that the light-emitting element ED is an organic light-emitting element, but the present disclosure is not particularly limited thereto.

The light-emitting element ED may include a first electrode AE, an emission layer EL, and a second electrode CE.

The first electrode AE may be disposed on the sixth insulating layer 60. The first electrode AE may extend along an upper surface of the sixth insulating layer 60. The first electrode AE may be connected to the second connection electrode CNE2 through a third contact hole CNT3 penetrating the sixth insulating layer 60. The third contact hole CNT3 may coincide with the second contact hole CNT2.

A pixel defining layer 70 may be disposed on the sixth insulating layer 60 and may cover a portion of the first electrode AE. An opening 70-OP is defined in the pixel defining layer 70. The opening 70-OP of the pixel defining layer 70 exposes at least a portion of the first electrode AE.

The active area AA (refer to FIG. 1) may include an emission area PXA and a non-emission area NPXA adjacent to the emission area PXA. The non-emission area NPXA may surround the emission area PXA. In this embodiment, the emission area PXA corresponds to a partial area of the first electrode AE, which is exposed by the opening 70-OP.

The emission layer EL may be disposed on the first electrode AE. The emission layer EL may be disposed in an area formed by the opening 70-OP. In other words, the emission layer EL may be independently disposed for each pixel. In the case where a plurality of emission layers EL are independently formed for respective pixels, each of the plurality of emission layers EL may emit a light of at least one of a blue color, a red color, and a green color. However, the present disclosure is not limited thereto. For example, the plurality of emission layers EL may be connected to each other to be provided in common to the plurality of pixels. In this case, the emission layer EL that is provided in common to the plurality of pixels may provide a blue light or may provide a white light.

The second electrode CE may be disposed on the emission layer EL. The second electrode CE may include a plurality of second electrodes CE to be independently formed for each pixel. Alternatively, the plurality of second electrodes CE may be connected to each other to be disposed in common in the plurality of pixels.

A hole control layer may be interposed between the first electrode AE and the emission layer EL. The hole control layer may be disposed in common in the emission area PXA and the non-emission area NPXA. The hole control layer may include a hole transport layer and may further include a hole injection layer. An electron control layer may be interposed between the emission layer EL and the second electrode CE. The electron control layer may include an electron transport layer and may further include an electron injection layer. The hole control layer and the electron control layer may be formed in common in a plurality of pixels by using an open mask.

The encapsulation layer 140 may be disposed on the light-emitting element layer 130. The encapsulation layer 140 may include an inorganic layer, an organic layer, and an inorganic layer sequentially stacked, and layers constituting the encapsulation layer 140 are not limited thereto.

The inorganic layers may protect the light-emitting element layer 130 from moisture and oxygen, and the organic layer may protect the light-emitting element layer 130 from a foreign material such as dust particles. The inorganic layers may include a silicon nitride layer, a silicon oxynitride layer, a silicon oxide layer, a titanium oxide layer, an aluminum oxide layer, or the like. The organic layer may include, but is not limited to, an acrylic-based organic layer.

The input sensor 200 may include a base insulating layer 210, a first conductive layer 220, a sensing insulating layer 230, a second conductive layer 240, and a cover insulating layer 250.

The base insulating layer 210 may be an inorganic layer including at least one of silicon nitride, silicon oxynitride, and silicon oxide. Alternatively, the base insulating layer 210 may be an organic layer including an epoxy resin, an acrylic resin, or an imide-based resin. The base insulating layer 210 may have a single-layer structure or may be a multilayer structure in which a plurality of layers are stacked along the third direction DR3.

Each of the first conductive layer 220 and the second conductive layer 240 may have a single-layer structure or may have a multilayer structure in which a plurality of layers are stacked along the third direction DR3.

A conductive layer of a single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), or indium zinc tin oxide (IZTO). In addition, the transparent conductive layer may include conductive polymer such as PEDOT, metal nanowire, graphene, or the like.

A conductive layer of a multilayer structure may include metal layers. The metal layers may have, for example, a three-layer structure of titanium/aluminum/titanium. The conductive layer of the multilayer structure may include at least one metal layer and at least one transparent conductive layer.

At least one of the sensing insulating layer 230 and the cover insulating layer 250 may include an inorganic layer. The inorganic layer may include at least one of aluminum oxide, titanium oxide, silicon oxide, silicon nitride, silicon oxynitride, zirconium oxide, and hafnium oxide.

At least one of the sensing insulating layer 230 and the cover insulating layer 250 may include an organic layer. The organic layer may include at least one of acrylate-based resin, methacrylate-based resin, polyisoprene-based resin, vinyl-based resin, epoxy-based resin, urethane-based resin, cellulose-based resin, siloxane-based resin, polyimide-based resin, polyamide-based resin, and perylene-based resin.

A parasitic capacitance Cb may be present between the input sensor 200 and the second electrode CE. The parasitic capacitance Cb may also be referred to as a "base capacitance". As a distance between the input sensor 200 and the second electrode CE decreases, a value of the parasitic capacitance Cb may become greater. As the value of the parasitic capacitance Cb becomes greater, the signal interference between the input sensor 200 and the display panel 100 may increase.

Figure 5:
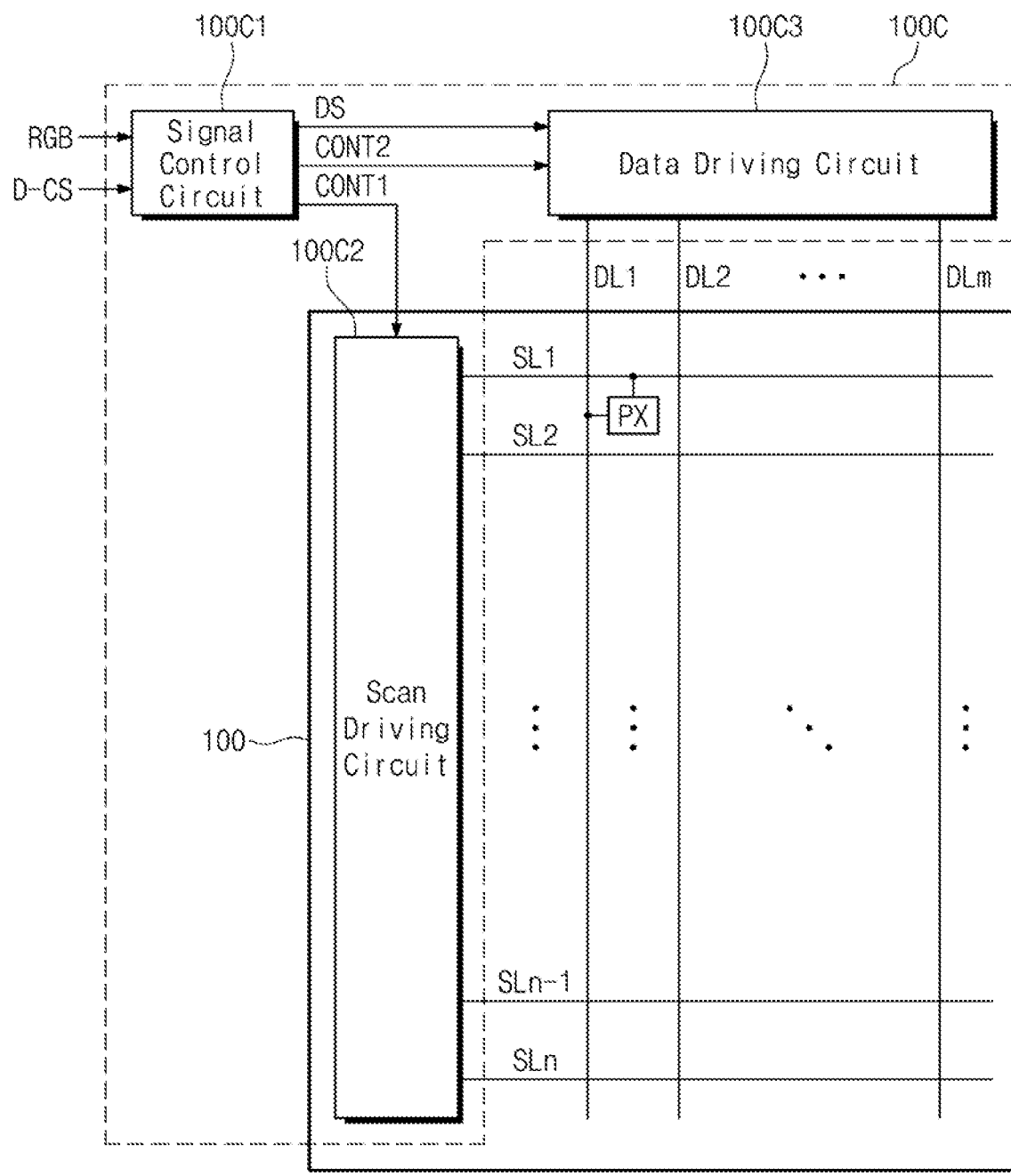
FIG. 5 is a block diagram of a display panel and a panel driver according to an embodiment of the present disclosure.

FIG. 5 is a block diagram of a display panel and a panel driver according to an embodiment of the present disclosure.

Referring to FIG. 5, the display panel 100 may include a plurality of scan lines SL1 to SLn (e.g., SL1, SL2, . . . . SLn−1, SLn), a plurality of data lines DL1 to DLm (e.g., DL1, DL2, . . . DLm), and a plurality of pixels PX. Each of the plurality of pixels PX is connected with a corresponding data line of the plurality of data lines DL1 to DLm and may be connected with a corresponding scan line of the plurality of scan lines SL1 to SLn. In an embodiment of the present disclosure, the display panel 100 may further include emission control lines, and the panel driver 100C may further include an emission driving circuit that provides control signals to the emission control lines. A configuration of the display panel 100 is not particularly limited.

Each of the plurality of scan lines SL1 to SLn may extend in the first direction DR1, and the plurality of scan lines SL1 to SLn may be arranged to be spaced from each other in the second direction DR2. Each of the plurality of data lines DL1 to DLm may extend in the second direction DR2, and the plurality of data lines DL1 to DLm may be arranged to be spaced from each other in the first direction DR1.

The panel driver 100C may include a signal control circuit 100C1, a scan driving circuit 100C2, and a data driving circuit 100C3.

The signal control circuit 100C1 may receive the image data RGB and the display control signal D-CS from the main controller 1000C (refer to FIG. 2). The display control signal D-CS may include various control signals. For example, the display control signal D-CS may include a vertical synchronization signal, a horizontal synchronization signal, a main clock, a data enable signal, and the like.

The signal control circuit 100C1 may generate a scan control signal CONT1 based on the display control signal D-CS and may output the scan control signal CONT1 to the scan driving circuit 100C2. The scan control signal CONT1 may include a vertical start signal, a clock signal, and the like. The signal control circuit 100C1 may generate a data control signal CONT2 based on the display control signal D-CS and may output the data control signal CONT2 to the data driving circuit 100C3. The data control signal CONT2 may include a horizontal start signal, an output enable signal, and the like.

In addition, the signal control circuit 100C 1 may output a data signal DS, which is obtained by processing the image data RGB to comply with an operating condition of the display panel 100, to the data driving circuit 100C3. The scan control signal CONT1 and the data control signal CONT2 that are signals necessary for operations of the scan driving circuit 100C2 and the data driving circuit 100C3 are not specifically limited.

The scan driving circuit 100C2 drives the plurality of scan lines SL1 to SLn in response to the scan control signal CONT1. In an embodiment of the present disclosure, the scan driving circuit 100C2 may be formed in the same process as the circuit layer 120 (refer to FIG. 4) in the display panel 100, but the present disclosure is not limited thereto. Optionally, the scan driving circuit 100C2 may be implemented with an integrated circuit (IC), for electrical connection with the display panel 100. In this case, the integrated circuit may be directly mounted in a given area of the display panel 100 or may be mounted on a separate printed circuit board in a chip on film (COF) manner.

The data driving circuit 100C3 may output gray scale voltages to the plurality of data lines DL1 to DLm in response to the data control signal CONT2 and the data signal DS from the signal control circuit 100C1. The data driving circuit 100C3 may be implemented with an integrated circuit for electrical connection with the display panel 100. Here, the integrated circuit may be directly mounted in a given area of the display panel 100 or may be mounted on a separate printed circuit board in the chip on film manner. Optionally, the data driving circuit 100C3 may be formed in the same process as the circuit layer 120 (refer to FIG. 4) in the display panel 100.

Figure 6:
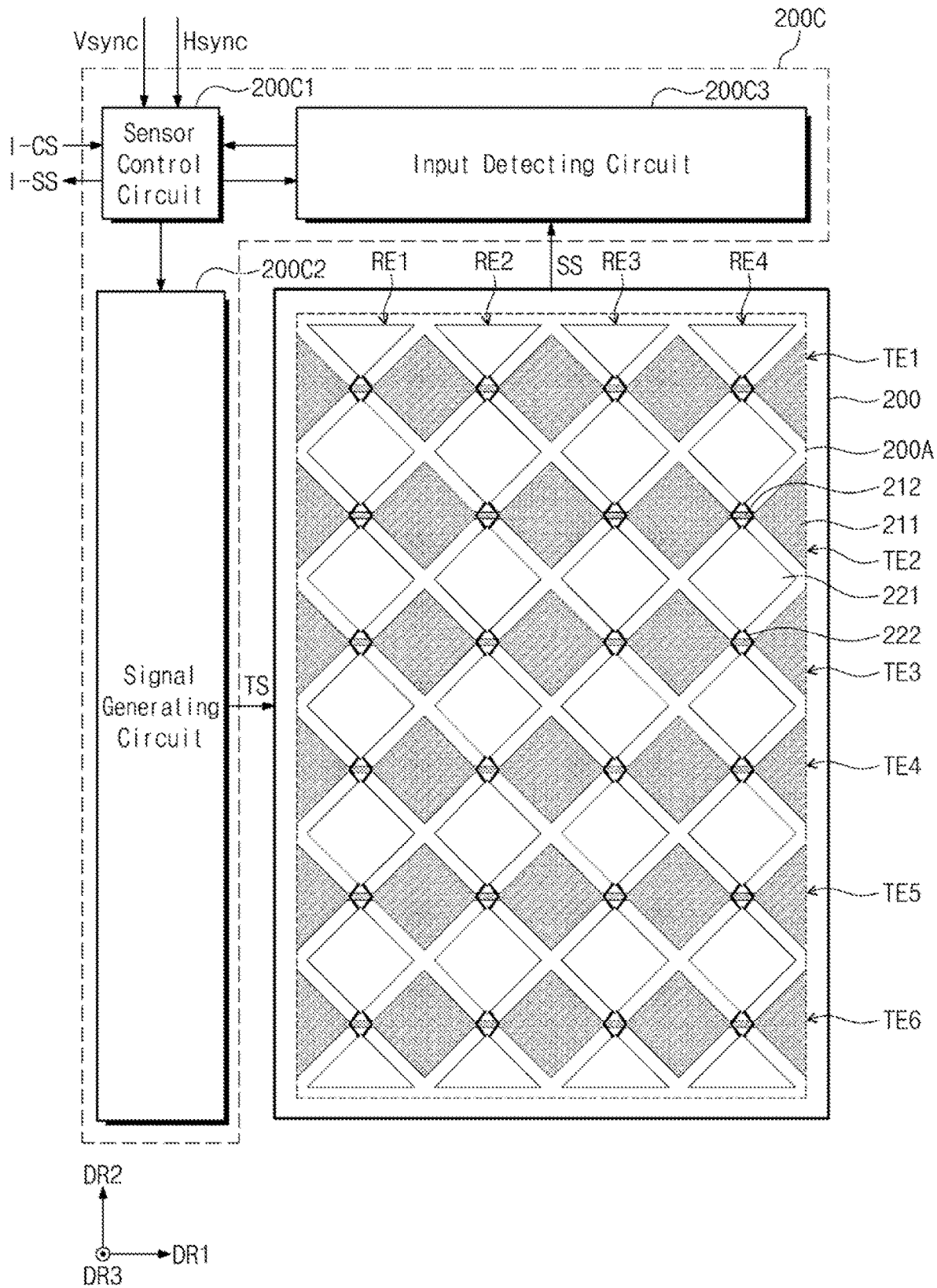
FIG. 6 is a block diagram of an input sensor and a sensor controller according to an embodiment of the present disclosure.

FIG. 6 is a block diagram of an input sensor and a sensor controller according to an embodiment of the present disclosure.

Referring to FIG. 6, the input sensor 200 may include a plurality of transmission electrodes TE1, TE2, TE3, TE4, TE5 and TE6 and a plurality of reception electrodes RE1, RE2, RE3 and RE4. The plurality of transmission electrodes TE1 to TE6 may extend in the first direction DR1 and may be arranged in the second direction DR2. In an embodiment of the present disclosure, the transmission electrodes TE1 to TE6 may extend along the scan lines SL1 to SLn (refer to FIG. 5). The plurality of reception electrodes RE1 to RE4 may extend in the second direction DR2 and may be arranged in the first direction DR1. The plurality of transmission electrodes TE1 to TE6 and the plurality of reception electrodes RE1 to RE4 may cross each other. A capacitance may be formed between the plurality of transmission electrodes TE1 to TE6 and the plurality of reception electrodes RE1 to RE4. For convenience of description, six transmission electrodes TE1 to TE6 and four reception electrodes RE1 to RE4 are illustrated in FIG. 6, but the number of transmission electrodes TE1 to TE6 and the number of reception electrodes RE1 to RE4 are not particularly limited thereto.

The input sensor 200 may further include a plurality of first signal lines connected to the plurality of transmission electrodes TE1 to TE6 and a plurality of second signal lines connected to the plurality of reception electrodes RE1 to RE4.

Each of the plurality of transmission electrodes TE1 to TE6 may include a first sensing portion 211 and a connection portion 212. The connection portion 212 may connect two adjacent first sensing portions 211 to each other. The first sensing portion 211 and the connection portion 212 may have an integrated shape and may be disposed in the same layer. For example, the first sensing portion 211 and the connection portion 212 may be included in the second conductive layer 240 (refer to FIG. 4). Alternatively, the first sensing portion 211 and the connection portion 212 may be included in the first conductive layer 220 (refer to FIG. 4).

Each of the plurality of reception electrodes RE1 to RE4 may include a second sensing portion 221 and a bridge portion 222. The second sensing portions 221 adjacent to each other may be electrically connected by the bridge portion 222, but the present disclosure is not particularly limited thereto. The second sensing portion 221 and the bridge portion 222 may be disposed in different layers. For example, the second sensing portion 221 may be included in the second conductive layer 240, and the bridge portion 222 may be included in the first conductive layer 220. Alternatively, the second sensing portion 221 may be included in the first conductive layer 220, and the bridge portion 222 may be included in the second conductive layer 240.

The bridge portion 222 may be insulated from the connection portion 212 and may intersect the connection portion 212. When the first and second sensing portions 211 and 221 and the connection portion 212 are included in the second conductive layer 240, the bridge portion 222 may be included in the first conductive layer 220. Alternatively, when the first and second sensing portions 211 and 221 and the connection portion 212 are included in the first conductive layer 220, the bridge portion 222 may be included in the second conductive layer 240.

Each of the plurality of transmission electrodes TE1 to TE6 may have a mesh shape, and each of the plurality of reception electrodes RE1 to RE4 may have a mesh shape.

The sensor controller 200C may receive the sensing control signal i-CS from the main controller 1000C (refer to FIG. 2) and may provide the coordinate signal I-SS to the main controller 1000C. The sensor controller 200C may be implemented with an integrated circuit (IC), for electrical connection with the input sensor 200. Here, the integrated circuit may be directly mounted in a given area of the input sensor 200 or the display panel 100 or may be mounted on a separate printed circuit board in the chip on film manner.

The sensor controller 200C may include a sensor control circuit 200C1, a signal generating circuit 200C2, and an input detecting circuit 200C3. The sensor control circuit 200C1 may receive a synchronization signal from the main controller 1000C or the signal control circuit 100C1. The sensor control circuit 200C1 may control operations of the signal generating circuit 200C2 and the input detecting circuit 200C3 based on the sensing control signal I-CS and the synchronization signal. In an embodiment of the present disclosure, the synchronization signal may include a vertical synchronization signal Vsync and a horizontal synchronization signal Hsync. Alternatively, the synchronization signal may include only one (e.g., the horizontal synchronization signal Hsync) of the vertical synchronization signal Vsync and the horizontal synchronization signal Hsync.

The signal generating circuit 200C2 may output transmission signals TS to the transmission electrodes TE1 to TE6 of the input sensor 200. The input detecting circuit 200C3 may receive sensing signals SS from the reception electrodes RE1 to RE4 of the input sensor 200. The input detecting circuit 200C3 may convert an analog signal into a digital signal. For example, the input detecting circuit 200C3 may perform amplification and filtering on the sensing signals SS of an analog form thus received and may convert a signal(s) that has undergone the amplification and filtering into a digital signal(s).

The sensor control circuit 200C1 may generate the coordinate signal I-SS based on the digital signal received from the input detecting circuit 200C3. For example, when the external input 2000 (refer to FIG. 2) (e.g., a touch input) by a finger of the user is sensed, the sensor control circuit 200C1 may generate the coordinate signal I-SS including information about coordinates, at which the touch input is made, by using the above digital signal.

Figure 7:
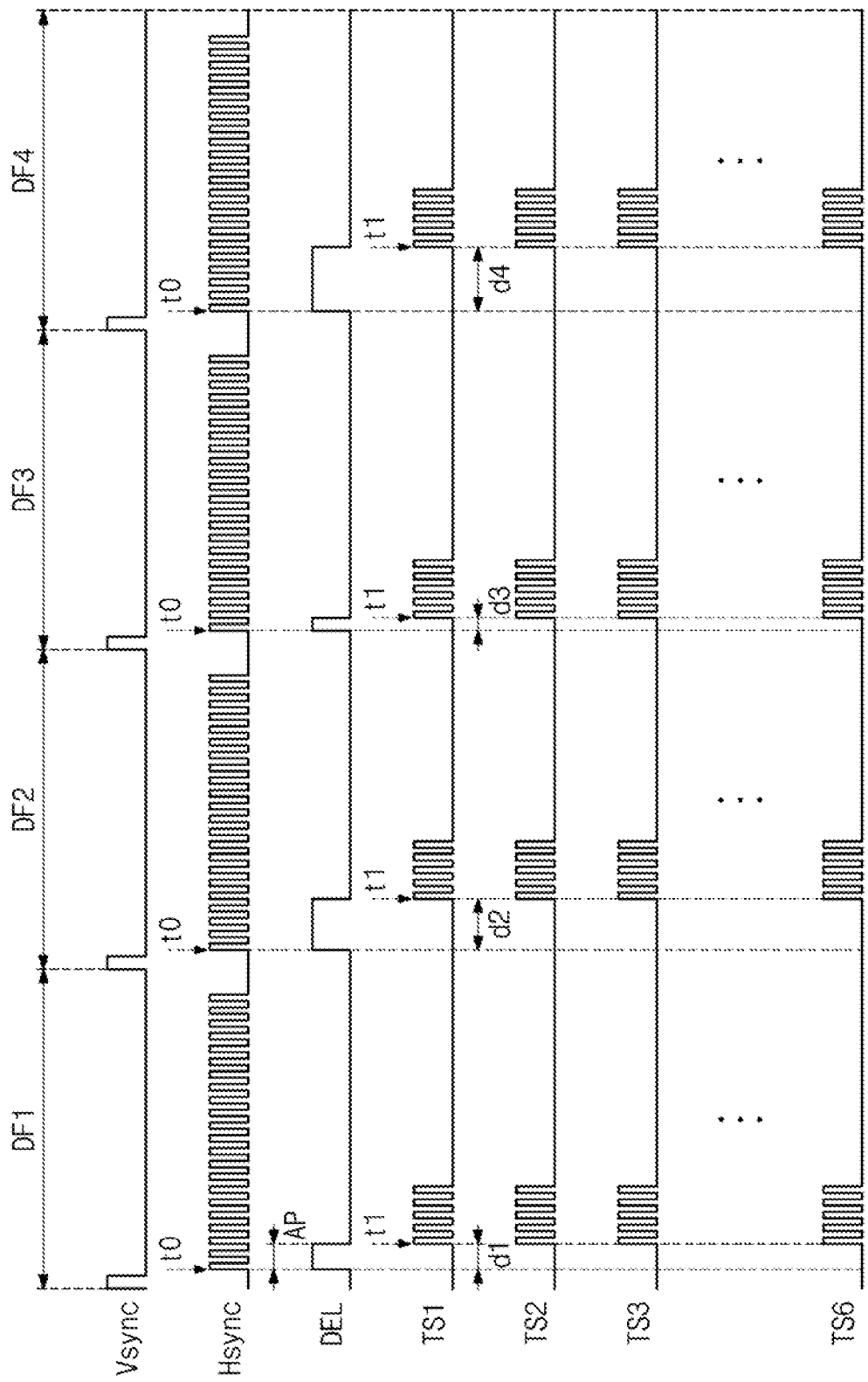
FIG. 7 is a waveform diagram illustrating transmission signals according to an embodiment of the present disclosure.

FIG. 7 is a waveform diagram illustrating transmission signals according to an embodiment of the present disclosure. FIG. 8A is a diagram illustrating delay information stored in a store table according to an embodiment of the present disclosure. FIG. 8B is a diagram illustrating delay information stored in a store table according to an embodiment of the present disclosure.

Referring to FIGS. 5 and 7, the display device 1000 displays an image through the display panel 100. A time unit by which the display panel 100 displays an image may be referred to as a "frame". When an operating frequency of the display panel 100 is 60 Hz, 60 frames may be displayed per second, and a time corresponding to each frame may be about 16.67 ms. When an operating frequency of the display panel 100 is 120 Hz, 120 frames may be displayed per second, and a time corresponding to each frame may be about 8.3 ms. A period of each of the frames may be determined by the vertical synchronization signal Vsync. For convenience of description, four frames (hereinafter referred to as "first to fourth frames DF1 to DF4") of the frames are illustrated in FIG. 7.

After each of the frames DF1 to DF4 starts, a time at which a scan signal is actually applied to the scan lines SL1 to SLn of the display panel 100 (e.g., a scan timing of the display panel 100) may be determined by the horizontal synchronization signal Hsync. For example, in each of the frames DF1 to DF4, after the vertical synchronization signal Vsync is activated, a scan signal may be applied to the scan lines SL1 to SLn from a time at which the horizontal synchronization signal Hsync is first activated.

Referring to FIGS. 6 and 7, the sensor controller 200C may drive the input sensor 200. In an embodiment of the present disclosure, an operating frequency of the input sensor 200 may be identical to an operating frequency of the display panel 100. For example, when the operating frequency of the display panel 100 is 60 Hz, the operating frequency of the input sensor 200 may also be 60 Hz, when the operating frequency of the display panel 100 is 120 Hz, the operating frequency of the input sensor 200 may also be 120 Hz. It is to be understood, however, that the operating frequencies of the display panel 100 and the input sensor 200 may be different.

The transmission signals TS may be output to the transmission electrodes TE1 to TE6 (hereinafter referred to as "first to sixth transmission electrodes TE1 to TE6"), respectively. Here, the transmission signals TS may include first to sixth transmission signals TS1 to TS6 (e.g., TS1, TS2, TS3, TS4, TS5 and TS6) that are respectively output to the first to sixth transmission electrodes TE1 to TE6. The first to sixth transmission signals TS1 to TS6 may be randomly (or varyingly) output (or generated) based on a synchronization signal (e.g., the horizontal synchronization signal Hsync).

In an embodiment of the present disclosure, the first to sixth transmission signals TS to TS6 may be simultaneously output from the sensor controller 200C at the same point in time. When a time at which the first to sixth transmission signals TS1 to TS6 are simultaneously output is referred to as an output point in time t1, a time interval between an activation start point in time t0 of the horizontal synchronization signal Hsync and the output point in time t1 may be randomly varied.

For example, in the first frame DF1, the activation start point in time t0 and the output point in time t1 are spaced from each other as much as a first time interval d1. In the second frame DF2, the activation start point in time t0 and the output point in time t1 are spaced from each other as much as a second time interval d2. The first time interval d1 may be different from the second time interval d2. For example, the second time interval d2 may be greater than the first time interval d1. In the third frame DF3, the activation start point in time t0 and the output point in time t1 are spaced from each other as much as a third time interval d3, and the third time interval d3 may be different from the first and second time intervals d1 and d2. For example, the third time interval d3 may be less than each of the first and second time intervals d1 and d2. In the fourth frame DF4, the activation start point in time t0 and the output point in time t1 are spaced from each other as much as a fourth time interval d4, and the fourth time interval d4 may be different from the first, second, and third time intervals d1, d2, and d3. For example, the fourth time interval d4 may be greater than each of the first, second and third time intervals d1, d2 and d3.

In an embodiment of the present disclosure, a time interval between the activation start point in time 10 and the output point in time t1 may be randomly varied between the first to fourth time intervals d1, d2, d3, and d4. Each of the first to fourth time intervals d1, d2, d3, and d4 may have one value in a given reference range. For example, when the reference range is from 0.1 µs to 0.8 µs, each of the first to fourth time intervals d1, d2, d3, and d4 may have one of values belonging to the range from 0.1 µs to 0.8 µs.

In an embodiment of the present disclosure, the first time interval d1 may have a value of 0.3 µs, the second time interval d2 may have a value of 0.5 µs, the third time interval d3 may have a value of 0.1 µs, and the fourth time interval d4 may have a value of 0.7 µs. The first to fourth time intervals d1, d2, d3, and d4 may be determined by a delay signal DEL. For example, duration of an activation period AP of the delay signal DEL may correspond to length of the first to fourth time intervals d1, d2, d3 and d4.

Referring to FIGS. 2, 7, and 8A, delay information that is used to delay the transmission signals TS1 to TS6 may be stored in advance in a store or lookup table LUT1. The store table LUT1 may be a component included in the sensor controller 200C or may be a component included in the main controller 1000C. When the store table LUT1 is stored in the sensor controller 200C, the sensor controller 200C may generate the delay signal DEL based on the delay information stored in advance in the store table LUT1. In this case, the sensor controller 200C may randomly vary the output point in time t1 of the transmission signals TS1 to TS6 every frame, based on the delay signal DEL and the horizontal synchronization signal Hsync.

When the store table LUT1 is stored in the main controller 1000C, the main controller 1000C may generate the delay signal DEL based on the delay information stored in advance in the store table LUT1. The delay signal DEL thus generated may be provided to the sensor controller 200C. The delay signal DEL may be a signal included in the sensing control signal I-CS.

The duration of the activation period AP of the delay signal DEL may vary depending on bit information of the delay information. In an embodiment of the present disclosure, the delay information may be composed of 2-bit data. When the bit information is "00", the activation period AP of the delay signal DEL may have duration of 0.1 µs, when the bit information is "01", the activation period AP of the delay signal DEL may have duration of 0.3 µs, when the bit information is "10", the activation period AP of the delay signal DEL may have duration of 0.5 µs, and when the bit information is "11", the activation period AP of the delay signal DEL may have duration of 0.7 µs. When the delay information is composed of 2-bit data, the activation period AP of the delay signal DEL may be randomly varied to correspond to one of four durations.

As illustrated in FIGS. 7 and 8B, the delay information stored in a store table LUT2 may be composed of 3-bit data. When the bit information is "000", the activation period AP of the delay signal DEL may have duration of 0.1 μs, when the bit information is "001", the activation period AP of the delay signal DEL may have duration of 0.2 μs, and when the bit information is "010", the activation period AP of the delay signal DEL may have duration of 0.3 μs. In addition, when the bit information is "011", the activation period AP of the delay signal DEL may have duration of 0.4 μs, when the bit information is "100", the activation period AP of the delay signal DEL may have duration of 0.5 μs, when the bit information is "101", the activation period AP of the delay signal DEL may have duration of 0.6 μs, when the bit information is "110", the activation period AP of the delay signal DEL may have duration of 0.7 μs, and when the bit information is "111", the activation period AP of the delay signal DEL may have duration of 0.8 μs. When the delay information is composed of 3-bit data, the activation period AP of the delay signal DEL may be randomly varied to correspond to one of eight durations.

The number of data bits of the delay information is not particularly limited, and the duration corresponding to each bit information is not particularly limited.

Each of the transmission signals TS1 to TS6 may be output from the output point in time t1 that is delayed with respect to the activation start point in time t0 of the horizontal synchronization signal Hsync as much as the activation period AP of the delay signal DEL. Because the duration of the activation period AP of the delay signal DEL is set to be randomly varied for each frame, a time interval between the activation start point in time t0 of the horizontal synchronization signal Hsync and the output point in time t1 may also be randomly varied for each frame.

Accordingly, a noise due to the interference between scan signals being supplied to the display panel 100 and the transmission signals TS1 to TS6 being supplied to the input sensor 200 may be prevented from occurring on a screen of the display device 1000 or may decrease. In addition, even though the noise occurs, a position at which the noise occurs may also be randomly shifted by randomly changing the above time interval. Accordingly, as the position at which the noise occurs is randomly shifted, the phenomenon that a flicker is viewed by a user's eyes may be prevented. Further, a period by which a time interval is varied may not be limited to one frame. For example, a time interval may be randomly varied in units of two frames or in units of three frames.

The description is given with reference to FIG. 7 as the output point in time t1 is randomly varied based on the horizontal synchronization signal Hsync, but the present disclosure is not limited thereto. For example, the output point in time t1 may be randomly varied based on the vertical synchronization signal Vsync. However, because the horizontal synchronization signal Hsync interworks with an output point in time of scan signals, it may be more effective to randomly vary the output point in time t1 of the transmission signals TS1 to TS6 based on the horizontal synchronization signal Hsync, rather than the vertical synchronization signal Vsync, in terms of preventing a flicker phenomenon.

According to an embodiment of the present disclosure, the display device 1000 may include: a display panel 100 configured to display an image in units of a frame (e.g., DF1 to DF4); an input sensor 200 disposed on the display panel 100, and configured to sense an external input 2000; a panel driver 100C configured to control driving of the display panel 100 in response to a synchronization signal (e.g., Hsync); and a sensor controller 200C configured to control driving of the input sensor 200, wherein the sensor controller 200C receives the synchronization signal (e.g., Hsync) from the panel driver 100C and outputs a plurality of transmission signals (e.g., TS1 to TS4) to the input sensor 200, and the plurality of transmission signals (e.g., TS1 to TS4) are varyingly generated based on the synchronization signal (e.g., Hsync).

Figure 9B:
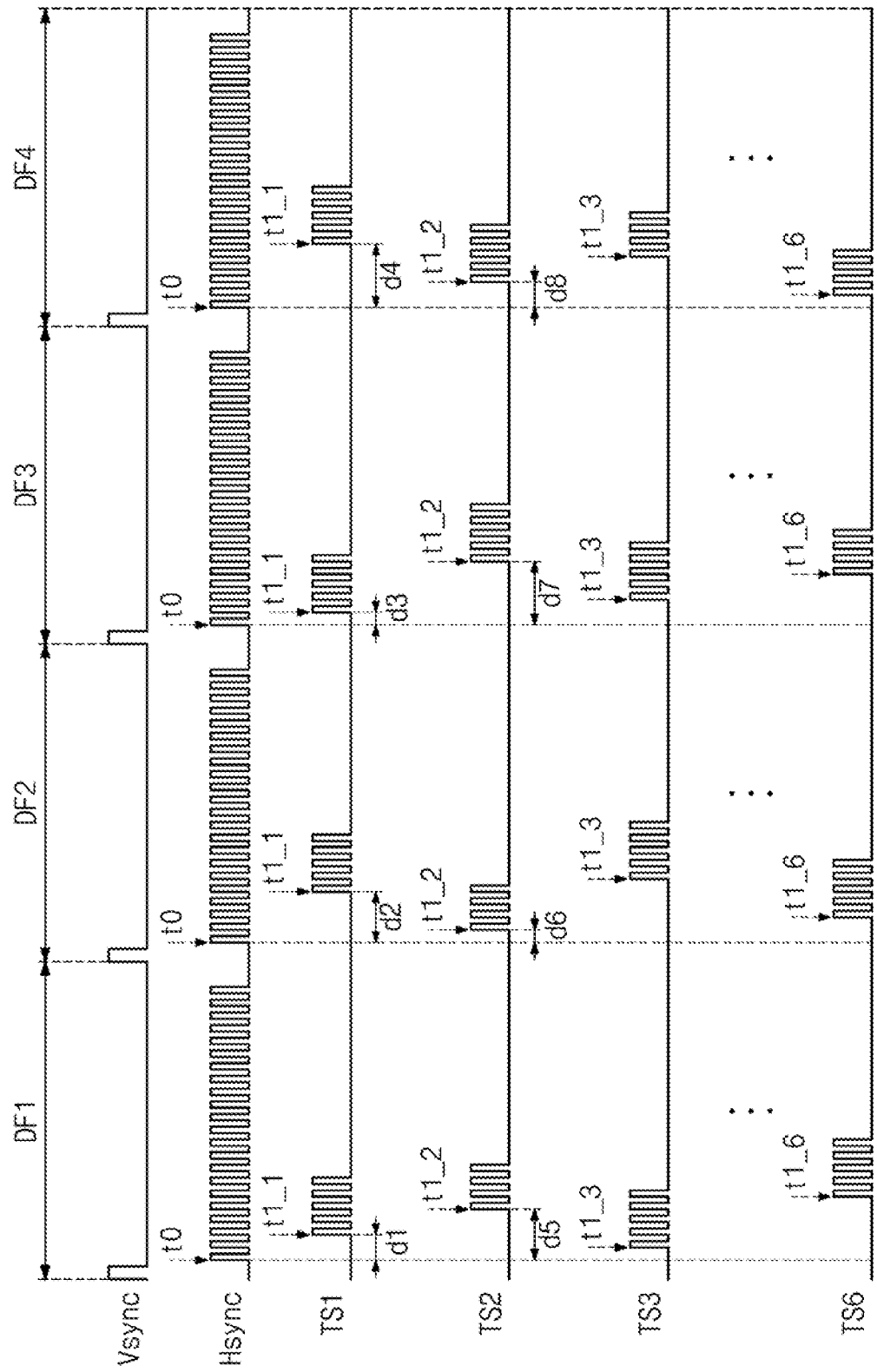
FIG. 9B is a waveform diagram illustrating transmission signals according to an embodiment of the present disclosure.

FIG. 9A is a waveform diagram illustrating delay signals according to an embodiment of the present disclosure, and FIG. 9B is a waveform diagram illustrating transmission signals according to an embodiment of the present disclosure.

Referring to FIGS. 6, 9A, and 9B, the transmission signals TS may include the first to sixth transmission signals TS) to TS6 that are respectively output to the first to sixth transmission electrodes TE1 to TE6. The first to sixth transmission signals TS1 to TS6 may be randomly (or varyingly) output (or generated) based on a synchronization signal (e.g., the horizontal synchronization signal Hsync).

In an embodiment of the present disclosure, the first to sixth transmission signals TS1 to TS6 may be output from the sensor controller 200C at different points in time. In other words, the first to sixth transmission signals TS1 to TS6 may not be simultaneously output. In each frame, a point in time when the first transmission signal TS1 is output may be referred to as a first output point in time t1_1, a point in time when the second transmission signal TS2 is output may be referred to as a second output point in time t1_2, a point in time when the third transmission signal TS3 is output may be referred to as a third output point in time t1_3, and so forth. In other words, in each frame, the first to sixth transmission signals TS1 to TS6 may be respectively output at first to sixth output points in time t1_1 to t1_6. At least two of the first to sixth output points in time t1_1 to t1_6 may be placed at different points on a time axis.

A time interval between the activation start point in time t0 of the horizontal synchronization signal Hsync and the first output point in time t1_1 of the first transmission signal TS1 may be randomly varied. For example, in the first frame DF1, the activation start point in time t0 and the first output point in time t1_1 are spaced from each other as much as the first time interval d1. In the second frame DF2, the activation start point in time t0 and the first output point in time t1_1 are spaced from each other as much as the second time interval d2. The first time interval d1 may be different from the second time interval d2. For example, the second time interval d2 may be greater than the first time interval d1. In the third frame DF3, the activation start point in time t0 and the first output point in time t1_1 are spaced from each other as much as the third time interval d3, and the third time interval d3 may be different from the first and second time intervals d1 and d2. For example, the third time interval d3 may be smaller than each of the first and second time intervals d1 and d2. In the fourth frame DF4, the activation start point in time t0 and the first output point in time t1_1 are spaced from each other as much as the fourth time interval d4, and the fourth time interval d4 may be different from the first, second, and third time intervals d1, d2, and d3. For example, the fourth time interval d4 may be longer than each of the first, second, and third time intervals d1, d2, and d3.

A time interval between the activation start point in time t0 of the horizontal synchronization signal Hsync and the second output point in time t1_2 of the second transmission signal TS2 may be randomly varied. For example, in the first frame DF1, the activation start point in time t0 and the second output point in time t1_2 are spaced from each other as much as a fifth time interval d5. In the second frame DF2, the activation start point in time to and the second output point in time t1_2 are spaced from each other as much as a sixth time interval d6. The fifth time interval d5 may be different from the sixth time interval d6. In addition, the fifth time interval d5 may be different from the first time interval d1, and the sixth time interval d6 may be different from the second time interval d2. In the third frame DF3, the activation start point in time t0 and the second output point in time t1_2 are spaced from each other as much as a seventh time interval d7, and the seventh time interval d7 may be different from the fifth and sixth time intervals d5 and d6. In the fourth frame DF4, the activation start point in time t0 and the second output point in time t1_2 are spaced from each other as much as an eighth time interval d8, and the eighth time interval d8 may be different from the fifth, sixth, and seventh time intervals d5, d6, and d7. In addition, the seventh time interval d7 may be different from the third time interval d3, and the eighth time interval d8 may be different from the fourth time interval d4.

In FIG. 7, the output points in time t1 of the first to sixth transmission signals TS1 to TS6 may be varied simultaneously randomly, however, in FIG. 9B, the output points in time t1_1 to t1_6 of the first to sixth transmission signals TS1 to TS6 may be varied individually randomly. It may be more effective to randomly vary the output points in time t1_1 to t1_6 of the first to sixth transmission signals TS1 to TS6 independently of each other, in terms of the reduction of noise.

However, to control the output points in time t1_1 to t1_6 of the first to sixth transmission signals TS1 to TS6 independently of each other, the sensor controller 200C may require first to sixth delay signals DEL1 to DEL6 respectively associated with the first to sixth transmission signals TS1 to TS6. In other words, the first output point in time t1_1 of the first transmission signal TS1 may be determined by the first delay signal DEL1, the second output point in time t1_2 of the second transmission signal TS2 may be determined by the second delay signal DEL2, the third output point in time t1_3 of the third transmission signal TS3 may be determined by the third delay signal DEL3, and so forth.

A duration of each of activation periods AP1 to AP6 of the first to sixth delay signals DEL1 to DEL6 may be randomly varied in units of a frame. The duration of each of the activation periods AP1 to AP6 of the first to sixth delay signals DEL1 to DEL6 may be varied depending on the bit information of the delay information illustrated in FIGS. 8A and 8B. When the delay information is composed of 2-bit data, the duration of each of the activation periods AP1 to AP6 of the first to sixth delay signals DEL1 to DEL6 may be randomly varied to correspond to one of four durations. When the delay information is composed of 3-bit data, the duration of each of the activation periods AP1 to AP6 of the first to sixth delay signals DEL1 to DEL6 may be randomly varied to correspond to one of eight durations.

Figure 10A:
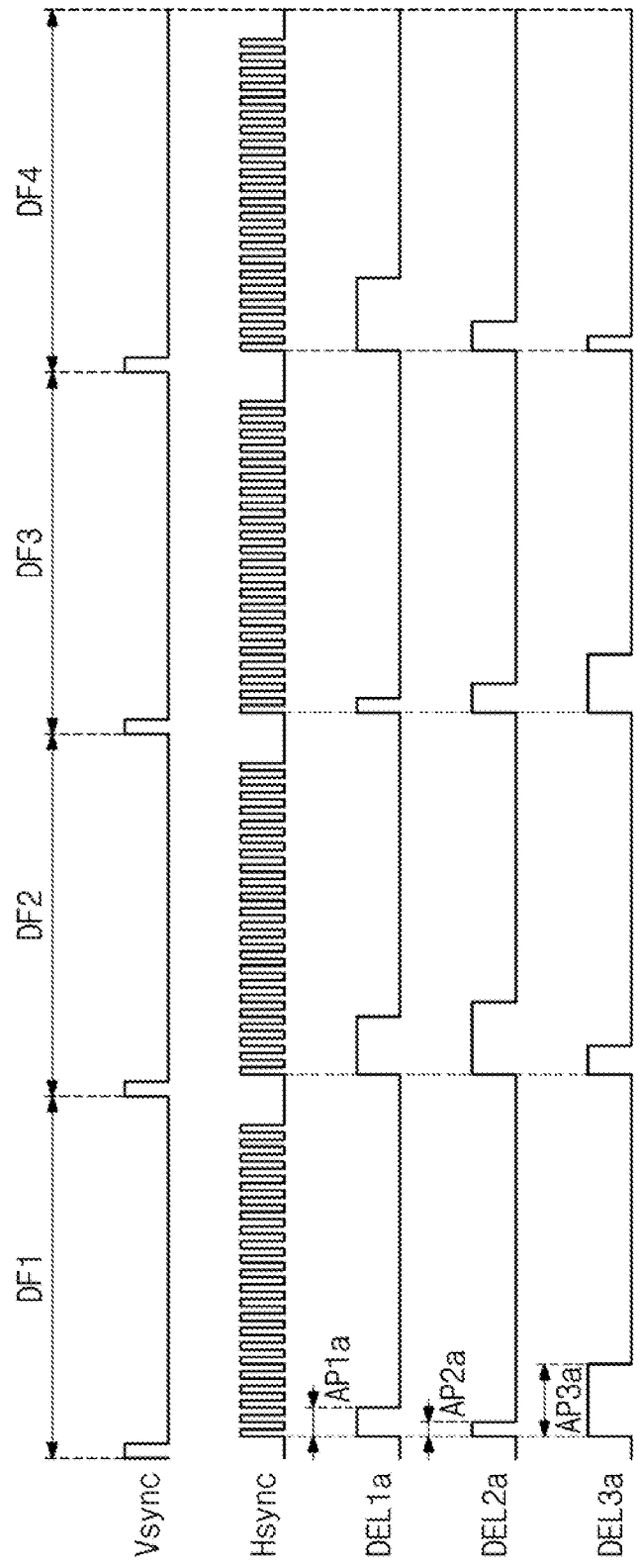
FIG. 10A is a waveform diagram illustrating delay signals according to an embodiment of the present disclosure.
Figure 10B:
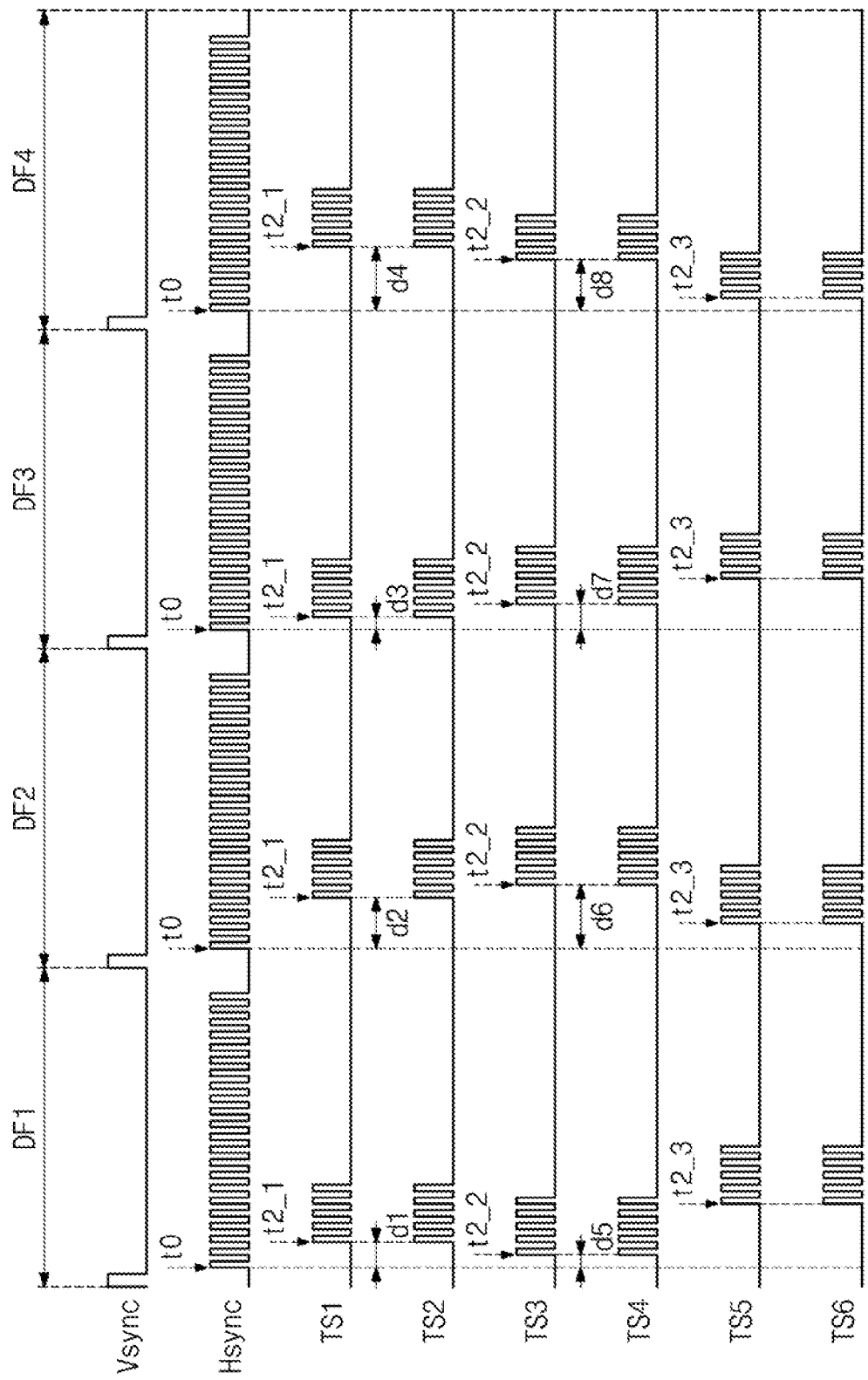
FIG. 10B is a waveform diagram illustrating transmission signals according to an embodiment of the present disclosure.

FIG. 10A is a waveform diagram illustrating delay signals according to an embodiment of the present disclosure, and FIG. 10B is a waveform diagram illustrating transmission signals according to an embodiment of the present disclosure.

Referring to FIGS. 6, 10A, and 10B, the transmission signals TS may include the first to sixth transmission signals TS1 to TS6 that are respectively output to the first to sixth transmission electrodes TE1 to TE6. The first to sixth transmission signals TS1 to TS6 may be randomly (or varyingly) output (or generated) based on a synchronization signal (e.g., the horizontal synchronization signal Hsync).

In an embodiment of the present disclosure, at least two of the first to sixth transmission signals TS1 to TS6 may be output from the sensor controller 200C' at different points in time. In each frame, the first to sixth transmission signals TS1 to TS6 may be classified into at least two groups, and transmission signals belonging to different groups may be output at different points in time. In addition, transmission signals belonging to the same group may be output at the same point in time.

For example, the first to sixth transmission signals TS1 to TS6 may be classified into three groups, and each group may include two transmission signals. In each frame, the first and second transmission signals TS1 and TS2 may be output at a first output point in time t2_1, the third and fourth transmission signals TS3 and TS4 may be output at a second output point in time t2_2, and the fifth and sixth transmission signals TS5 and TS6 may be output at a third output point in time t2.3. However, the present disclosure is not limited thereto. For example, the first and fourth transmission signals TS1 and TS4 may be output at the first output point in time t2_1, the second and fifth transmission signals TS2 and TS5 may be output at the second output point in time t2_2, the third and sixth transmission signals TS3 and TS6 may be output at the third output point in time t2_3. In addition, the number of transmission signals to be included in each group may be variously varied. For example, three transmission signals may be provided in a group.

A time interval between the activation start point in time t0 of the horizontal synchronization signal Hsync and the first output point in time t2_1 of the first and second transmission signals TS1 and TS2 may be randomly varied. For example, in the first frame DF1, the activation start point in time t0 and the first output point in time t2_1 are spaced from each other as much as the first time interval d1. In the second frame DF2, the activation start point in time t0 and the first output point in time t2_1 are spaced from each other as much as the second time interval d2. The first time interval d1 may be different from the second time interval d2. In the third frame DF3, the activation start point in time t0 and the first output point in time t2_1 are spaced from each other as much as the third time interval d3, and the third time interval d3 may be different from the first and second time intervals d1 and d2. In the fourth frame DF4, the activation start point in time t0 and the first output point in time t2_1 are spaced from each other as much as the fourth time interval d4, and the fourth time interval d4 may be different from the first, second, and third time intervals d1, d2, and d3.

A time interval between the activation start point in time t0 of the horizontal synchronization signal Hsync and the second output point in time t2_2 of the third and fourth transmission signals TS3 and TS4 may be randomly varied. For example, in the first frame DF1, the activation start point in time t0 and the second output point in time t2_2 are spaced from each other as much as the fifth time interval d5. In the second frame DF2, the activation start point in time t0 and the second output point in time t2_2 are spaced from each other as much as the sixth time interval d6. The fifth time interval d5 may be different from the sixth time interval d6. In addition, the fifth time interval d5 may be different from the first time interval d1, and the sixth time interval d6 may be different from the second time interval d2. In the third frame DF3, the activation start point in time t0 and the second output point in time t2_2 are spaced from each other as much as the seventh time interval d7, and the seventh time interval d7 may be different from the fifth and sixth time intervals d5 and d6. In the fourth frame DF4, the activation start point in time t0 and the second output point in time t2_2 are spaced from each other as much as the eighth time interval d8, and the eighth time interval d8 may be different from the fifth, sixth, and seventh time intervals d5, d6, and d7. In addition, the seventh time interval d7 may be different from the third time interval d3, and the eighth time interval d8 may be different from the fourth time interval d4.

In FIG. 9I, the output points in time t1_1 to t1_6 of the first to sixth transmission signals TS1 to TS6 may be varied randomly individually, however, in FIG. 10B, the first to sixth transmission signals TS1 to TS6 may be classified into a plurality of groups, and output points in time thereof may be varied randomly in units of a group.

When the output points in time t2_1 to t2_3 are controlled in units of a group, the sensor controller 200C may require delay signals DEL1a to DEL3a, the number of which corresponds to the number of groups. For example, when the first to sixth transmission signals TS1 to TS6 are classified into three groups, the sensor controller 200C may require three delay signals (e.g., the first to third delay signals DEL1a, DEL2a, and DEL3a). In this case, the first delay signal DEL1a may determine the first output point in time t2_1 of the first and second transmission signals TS1 and TS2, the second delay signal DEL2a may determine the second output point in time t2_2 of the third and fourth transmission signals TS3 and TS4, and the third delay signal DEL3a may determine the third output point in time t2_3 of the fifth and sixth transmission signals TS5 and TS6.

A duration of each of activation periods AP1a to AP3a of the first to third delay signals DEL1a to DEL3a may be randomly varied in units of a frame. The duration of each of the activation periods AP1a to AP3a of the first to third delay signals DEL1a to DEL3a may be varied depending on the bit information of the delay information illustrated in FIGS. 8A and 8B. When the delay information is composed of 2-bit data, the duration of each of the activation periods AP1a to AP3a of the first to third delay signals DEL1a to DEL3a may be randomly varied to correspond to one of four durations. When the delay information is composed of 3-bit data, the duration of each of the activation periods AP1a to AP3a of the first to third delay signals DEL1a to DEL3a may be randomly varied to correspond to one of eight durations.

Figure 11:
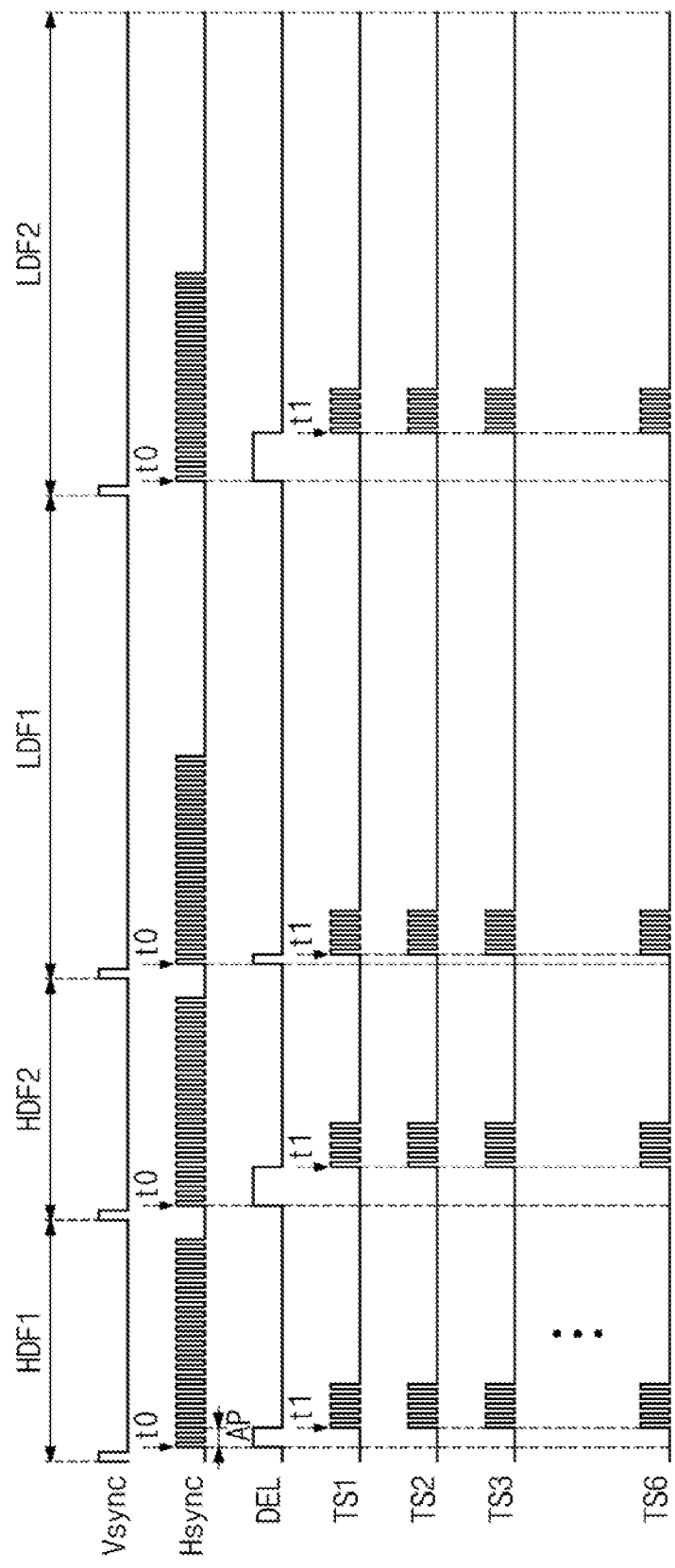
FIG. 11 is a waveform diagram illustrating transmission signals according to an embodiment of the present disclosure.

FIG. 11 is a waveform diagram illustrating transmission signals according to an embodiment of the present disclosure.

Referring to FIGS. 2 and 11, the panel driver 100C may drive the display panel 100 at a first operating frequency in a first driving mode and may drive the display panel 100 at a second operating frequency in a second driving mode. The second operating frequency may be lower than the first operating frequency. For example, the second operating frequency may be a frequency of 15 Hz, 30 Hz, or 48 Hz, and the first operating frequency may be a frequency of 60 Hz, 120 Hz, or 240 Hz. Below, an operating mode in which the operating frequency of the display panel 100 is variable may be referred to as a "variable frequency mode".

In the first driving mode, the display panel 100 may display a first image (e.g., a video) during a plurality of first frames HDF1 and HDF2. In the second driving mode, the display panel 100 may display a second image (e.g., a still image) during a plurality of second frames LDF1 and LDF2. A duration of each of the plurality of second frames LDF1 and LDF2 may be greater than a duration of each of the plurality of first frames HDF1 and HDF2.

The sensor controller 200C may drive the input sensor 200. In an embodiment of the present disclosure, an operating frequency of the input sensor 200 may be identical to an operating frequency of the display panel 100. When the driving mode of the display panel 100 switches from the first driving mode to the second driving mode or switches from the second driving mode to the first driving mode, the operating frequency of the input sensor 200 may be varied in conjunction with the operating frequency of the display panel 100. For example, in the first driving mode, when the operating frequency of the display panel 100 is 120 Hz, the operating frequency of the input sensor 200 may also be 120 Hz. In the second driving mode, when the operating frequency of the display panel 100 is 30 Hz, the operating frequency of the input sensor 200 may also be 30 Hz.

The first to sixth transmission signals TS1 to TS6 may be randomly (or varyingly) output (or generated) based on a synchronization signal (e.g., the horizontal synchronization signal Hsync) and the delay signal DEL. Even though the driving mode of the display panel 100 switches from the first driving mode to the second driving mode or from the second driving mode to the first driving mode, in each frame, an activation period of the horizontal synchronization signal Hsync may start from a given point in time t0. In addition, the delay signal DEL may have the first operating frequency in the first driving mode and may have the second operating frequency in the second driving mode.

In an embodiment of the present disclosure, the first to sixth transmission signals TS1 to TS6 may be simultaneously output from the sensor controller 200C at the same point in time. When a point in time when the first to sixth transmission signals TS1 to TS6 are simultaneously output is referred to as an output point in time t1, the output point in time t1 may be randomly varied based on the activation start point in time t0 of the horizontal synchronization signal Hsync.

As the output point in time t1 of the first to sixth transmission signals TS1 to TS6 are randomly varied based on the activation start point in time t0 of the horizontal synchronization signal Hsync, a random change for the output point in time t1 of the first to sixth transmission signals TS1 to TS6 may be maintained in conjunction with the operating frequency of the display panel 100.

The description is given with reference to FIG. 11 as the output point in time t1 is randomly varied based on the horizontal synchronization signal Hsync, but the present disclosure is not limited thereto. For example, the output point in time t1 may be randomly varied based on the vertical synchronization signal Vsync. However, because the horizontal synchronization signal Hsync interworks with an output point in time of scan signals, it may be more effective to randomly vary the output point in time t1 of the transmission signals TS1 to TS6 based on the horizontal synchronization signal Hsync, rather than the vertical synchronization signal Vsync, in terms of preventing a flicker phenomenon.

A period by which the output point in time t1 is varied may not be limited to one frame. For example, the output point in time t1 may be varied with a period of two frames or three frames. In addition, a period by which the output point in time t1 is varied may change depending on a driving mode of the display panel 100.

Only the case where the first to sixth transmission signals TS1 to TS6 are output at the output point in time t1 at the same time is illustrated in FIG. 11, but the present disclosure is not limited thereto. As illustrated in FIGS. 9A to 10B, the embodiments in which the first to sixth transmission signals TS1 to TS6 are output at different output points in time may also be applied to the display device 1000 that operates in the variable frequency mode illustrated in FIG. 11.

Figure 12A:
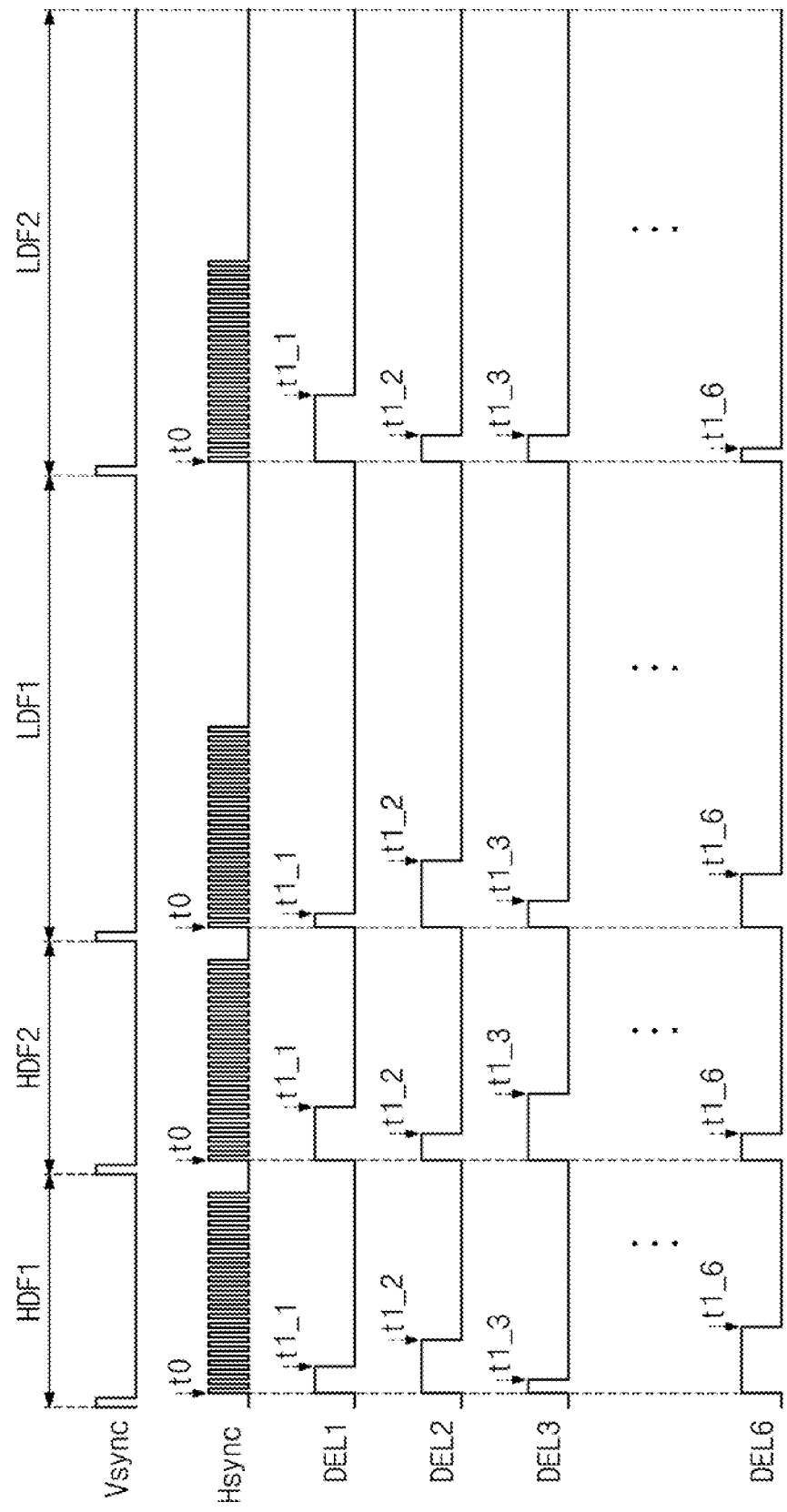
FIG. 12A is a waveform diagram illustrating delay signals according to an embodiment of the present disclosure.
Figure 12B:
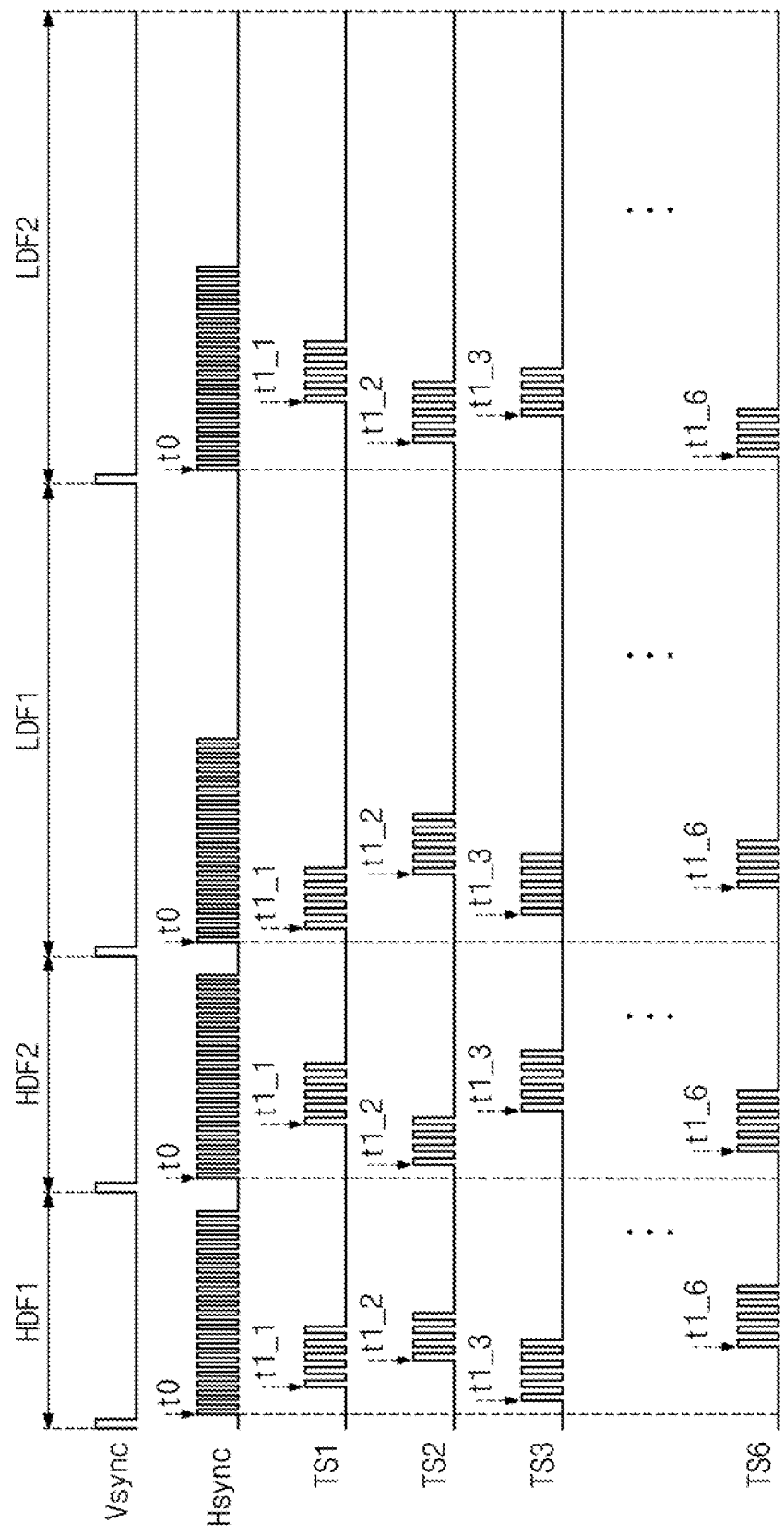
FIG. 12B is a waveform diagram illustrating transmission signals according to an embodiment of the present disclosure.

FIG. 12A is a waveform diagram illustrating delay signals according to an embodiment of the present disclosure, and FIG. 12B is a waveform diagram illustrating transmission signals according to an embodiment of the present disclosure.

Referring to FIGS. 6, 12A, and 12B, the first to sixth transmission signals TS1 to TS6 may be randomly (or varyingly) output (or generated) based on a synchronization signal (e.g., the horizontal synchronization signal H-sync). Even though the driving mode of the display panel 100 switches from the first driving mode to the second driving mode or from the second driving mode to the first driving mode, in each frame, an activation period of the horizontal synchronization signal Hsync may start from a given point in time to.

In an embodiment of the present disclosure, in each frame, the first to sixth transmission signals TS1 to TS6 may be output from the sensor controller 200C at different points in time. In each frame, a point in time when the first transmission signal TS1 is output may be referred to as the first output point in time t1_1, a point in time when the second transmission signal TS2 is output may be referred to as the second output point in time t1_2, a point in time when the third transmission signal TS3 is output may be referred to as the third output point in time t1_3, and so forth. In other words, in each frame, the first to sixth transmission signals TS1 to TS6 may be respectively output at the first to sixth output points in time t1_1 to t1_6. At least two of the first to sixth output points in time t1_1 to t1_6 may be placed at different points on a time axis.

The sensor controller 200C may generate the first to sixth delay signals DEL1 to DEL6 for randomly controlling the output points in time t1_1 to t1_6 of the first to sixth transmission signals TS1 to TS6 independently of each other. Each of the first to sixth delay signals DEL to DEL6 may have the first operating frequency in the first driving mode and may have the second operating frequency in the second driving mode.

The sensor controller 200C may randomly vary the output point in time t1_1 of the first transmission signal TS1 every frame, based on the first delay signal DEL1 and the horizontal synchronization signal Hsync. When the driving mode of the display panel 100 switches from the first driving mode to the second driving mode or from the second driving mode to the first driving mode, a frequency of the first delay signal DEL1 may also be varied in conjunction therewith. Accordingly, the output point in time t1_1 of the first transmission signal TS1 may also be randomly varied in conjunction with the driving mode of the display panel 100. Likewise, because the second to sixth transmission signals TS2 to TS6 are randomly varied based on the second to sixth delay signals DEL2 to DEL6, respectively, the output points in time t1_2 to t1_6 of the second to sixth transmission signals TS2 to TS6 may also be randomly varied in conjunction with the driving mode of the display panel 100.

Figure 13A:
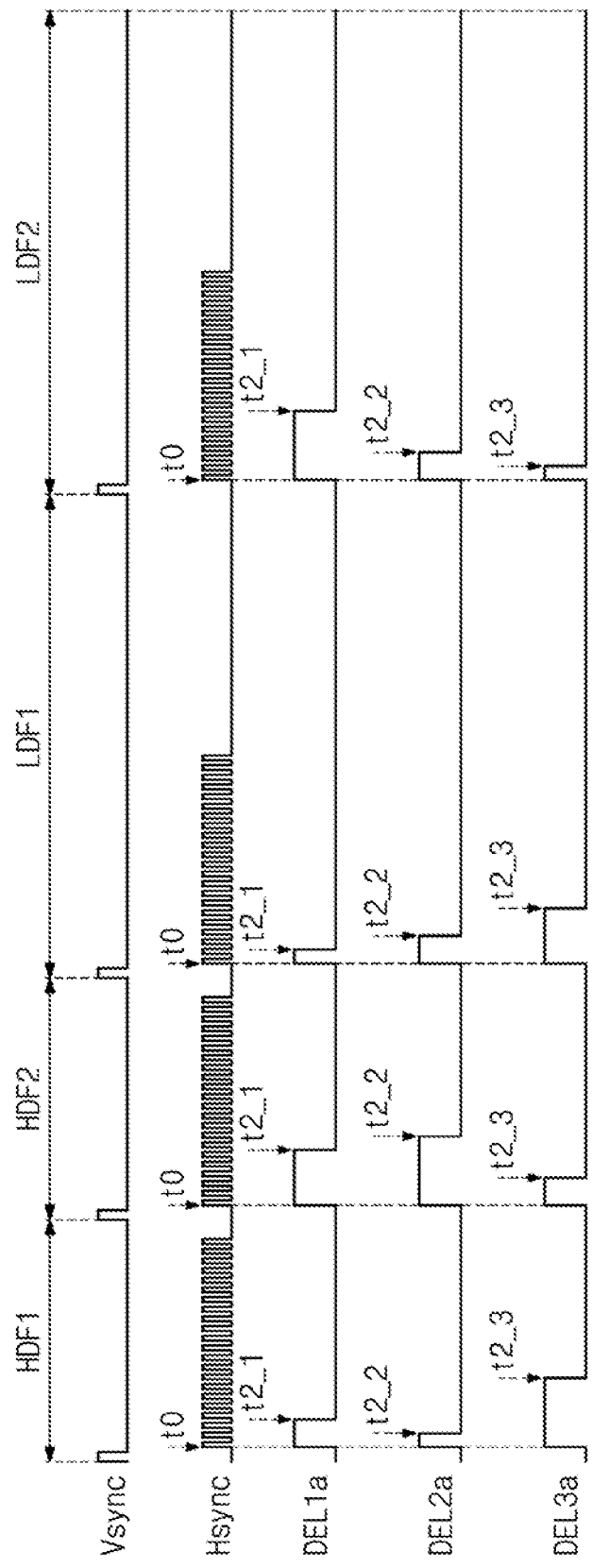
FIG. 13A is a waveform diagram illustrating delay signals according to an embodiment of the present disclosure.
Figure 13B:
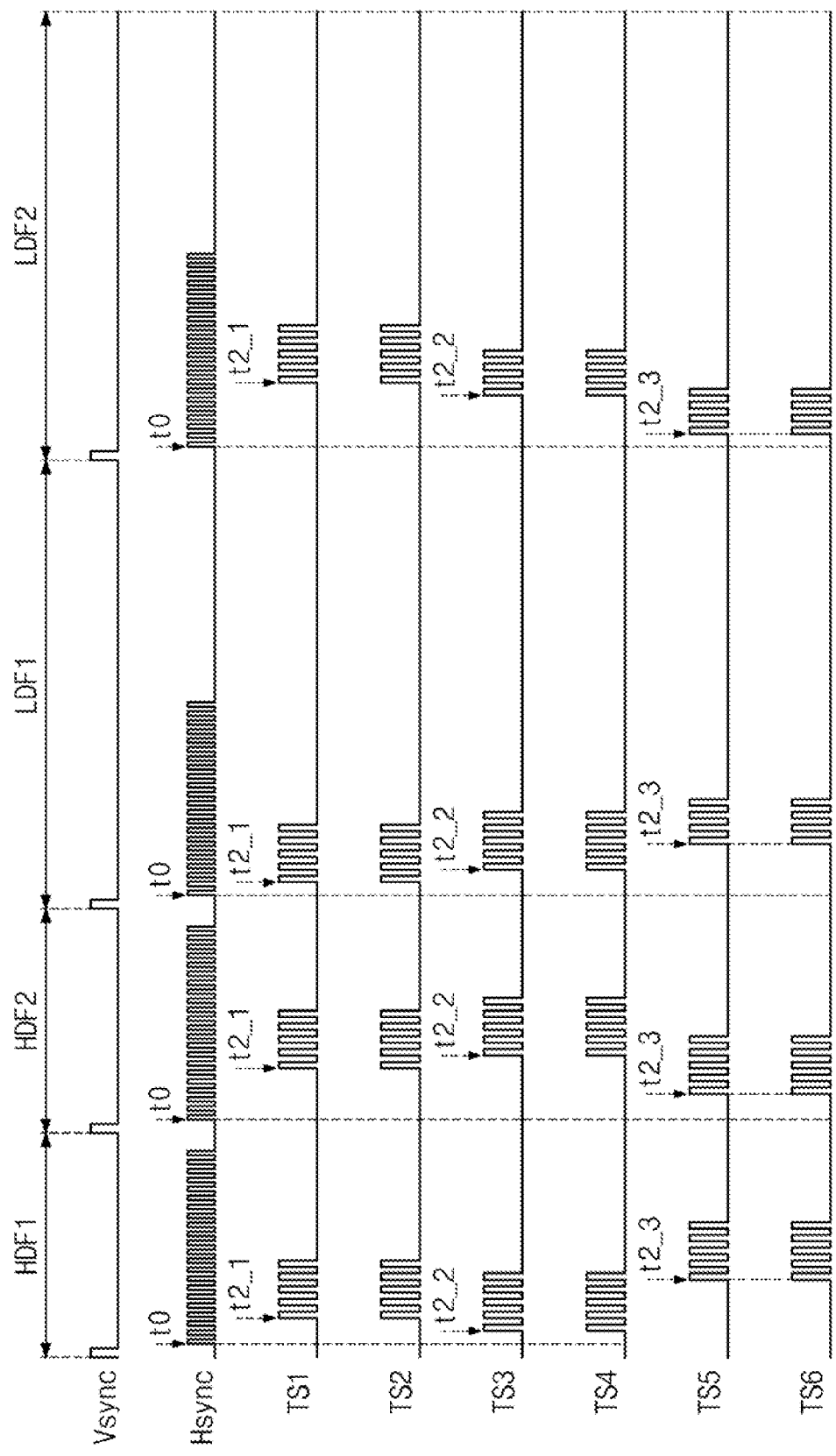
FIG. 13B is a waveform diagram illustrating transmission signals according to an embodiment of the present disclosure.

FIG. 13A is a waveform diagram illustrating delay signals according to an embodiment of the present disclosure, and FIG. 13B is a waveform diagram illustrating transmission signals according to an embodiment of the present disclosure.

Referring to FIGS. 6, 13A, and 13B, at least two of the first to sixth transmission signals TS1 to TS6 may be output from the sensor controller 200C at different points in time. In each frame, the first to sixth transmission signals TS1 to TS6 may be classified into at least two groups, and transmission signals belonging to different groups may be output at different points in time. In addition, transmission signals belonging to the same group may be output at the same point in time.

For example, the first to sixth transmission signals TS1 to TS6 may be classified into three groups, and each group may include two transmission signals. In each frame, the first and second transmission signals TS1 and TS2 may be output at the first output point in time t2_1, the third and fourth transmission signals TS3 and TS4 may be output at the second output point in time t2_2, and the fifth and sixth transmission signals TS5 and TS6 may be output at the third output point in time t2_3. However, the present disclosure is not limited thereto. For example, the first and fourth transmission signals TS1 and TS4 may be output at the first output point in time t2_1, the second and fifth transmission signals TS2 and TS5 may be output at the second output point in time t2_2, and the third and sixth transmission signals TS3 and TS6 may be output at the third output point in time t2_3. In addition, the number of transmission signals to be included in each group may be variously varied. For example, three or four transmission signals may be provided in each group, or a different number of transmission signals may be provided per group.

When the output points in time t2_1 to t2_3 are controlled in units of a group, the sensor controller 200C may require delay signals (e.g., the first, second, and third delay signals DEL1a, DEL2a, and DEL3a), the number of which corresponds to the number of groups. In this case, the first delay signal DEL1a may determine the first output point in time t2_1 of the first and second transmission signals TS1 and TS2, the second delay signal DEL2a may determine the second output point in time t2_2 of the third and fourth transmission signals TS3 and TS4, and the third delay signal DEL3a may determine the third output point in time t2_3 of the fifth and sixth transmission signals TS5 and TS6.

Each of the first to third delay signals DEL1a to DEL3a may have the first operating frequency in the first driving mode and may have the second operating frequency in the second driving mode.

The sensor controller 200C may randomly vary the output point in time t2_1 of the first and second transmission signals TS1 and TS2 every frame, based the first delay signal DEL1a and the horizontal synchronization signal Hsync. When the driving mode of the display panel 100 switches from the first driving mode to the second driving mode or from the second driving mode to the first driving mode, a frequency of the first delay signal DEL1a may also be varied in conjunction therewith. Accordingly, the output point in time t2_1 of the first and second transmission signals TS1 and TS2 may be randomly varied in conjunction with the driving mode of the display panel 100. Likewise, because the third and fourth transmission signals TS3 and TS4 are randomly varied based on the second delay signal DEL2a and the fifth and sixth transmission signals TS5 and TS6 are randomly varied based on the third delay signal DEL3a, the output points in time t2_2 and t2_3 of the third to sixth transmission signals TS3 to TS6 may also be randomly varied in conjunction with the driving mode of the display panel 100.

According to an embodiment of the present disclosure, a display device may randomly vary output points in time of transmission signals to be supplied to an input sensor based on a synchronization signal, and thus, a noise due to the interference between a display panel and the input sensor may be prevented from occurring on a screen of the display device or may decrease.

In addition, as the output points in time of the transmission signals are randomly varied, even though a noise occurs, a position at which the noise occurs may be randomly shifted. When a position at which the noise occurs is randomly shifted, the phenomenon that a flicker is viewed by a user's eyes may be prevented, and thus, the display quality of the display device may be increased.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device, comprising:
a display panel configured to display an image in units of a frame;
an input sensor disposed on the display panel, and configured to sense an external input;
a panel driver configured to control driving of the display panel in response to a synchronization signal; and
a sensor controller configured to control driving of the input sensor,
wherein the sensor controller receives the synchronization signal from the panel driver and outputs a plurality of transmission signals to the input sensor, and
the plurality of transmission signals are varyingly generated based on the synchronization signal,
wherein the plurality of transmission signals are output from the sensor controller at an output point in time, and
wherein a time interval between an activation start point in time of the synchronization signal and the output point in time is varied.

2. The display device of claim 1, wherein the time interval is randomly varied in units of at least one frame.

3. The display device of claim 1, wherein the sensor controller randomly varies the output point in time based on a delay signal.

4. The display device of claim 3, wherein the sensor controller outputs the plurality of transmission signals at the output point in time which is delayed with respect to the activation start point in time of the synchronization signal by as much as an activation period of the delay signal.

5. The display device of claim 4, wherein duration of the activation period of the delay signal is varied within a predetermined range in units of at least one frame.

6. The display device of claim 1, wherein a first transmission signal and a second transmission signal of the plurality of transmission signals are output from the sensor controller at different points in time.

7. The display device of claim 6, wherein a time interval between the activation start point in time of the synchronization signal and a first output point in time of the first transmission signal is randomly varied, and
wherein a time interval between the activation start point in time of the synchronization signal and a second output point in time of the second transmission signal is randomly varied.

8. The display device of claim 7, wherein the sensor controller determines output points in time of the plurality of transmission signals based on a plurality of delay signals.

9. The display device of claim 8, wherein the plurality of delay signals include:

a first delay signal for determining the first output point in time of the first transmission signal; and
a second delay signal for determining the second output point in time of the second transmission signal, and
wherein the sensor controller outputs the first transmission signal at the first output point in time which is delayed with respect to the activation start point in time of the synchronization signal by as much as an activation period of the first delay signal and outputs the second transmission signal at the second output point in time which is delayed with respect to the activation start point in time of the synchronization signal by as much as an activation period of the second delay signal.

10. The display device of claim 9, wherein a duration of the activation period of the first delay signal is varied within a predetermined range in units of at least one frame, and
wherein a duration of the activation period of the second delay signal is varied within the predetermined range in units of at least one frame.

11. The display device of claim 1, wherein the synchronization signal includes:
a vertical synchronization signal for determining a period of the frame; and
a horizontal synchronization signal for determining a scan timing of the display panel in the frame.

12. The display device of claim 1, wherein an operating frequency of the display panel is identical to an operating frequency of the input sensor.

13. The display device of claim 1, wherein the input sensor includes:
transmission electrodes for receiving the transmission signals; and
reception electrodes insulated from the transmission electrodes and intersecting the transmission electrodes.

14. The display device of claim 13, wherein the display panel includes scan lines for sequentially receiving a scan signal during the frame, and
wherein the transmission electrodes extend along the scan lines.

15. The display device of claim 1, wherein the display panel includes:
a light-emitting element layer including a light-emitting element; and
an encapsulation layer disposed on the light-emitting element layer.

16. The display device of claim 15, wherein the input sensor is directly disposed on the encapsulation layer.

17. A display device, comprising:
a display panel configured to display an image in units of a frame;
an input sensor disposed on the display panel, and configured to sense an external input;
a panel driver configured to control driving of the display panel in response to a vertical synchronization signal for determining a period of the frame and a horizontal synchronization signal for determining a scan timing of the display panel; and
a sensor controller configured to control driving of the input sensor,
wherein the sensor controller receives the horizontal synchronization signal from the panel driver and outputs a plurality of transmission signals to the input sensor, and
the plurality of transmission signals are varied based on the horizontal synchronization signal,
the plurality of transmission signals are output from the sensor controller at an output point in time, and wherein a time interval between an activation start point in time of the horizontal synchronization signal and the output point in time is varied.

18. The display device of claim 17, wherein the time interval is randomly varied in units of at least one frame.

* * * * *